(12) United States Patent
Park et al.

(10) Patent No.: US 11,292,023 B2
(45) Date of Patent: Apr. 5, 2022

(54) SUBSTRATE PROCESSING APPARATUS

(71) Applicant: WONIK IPS CO., LTD., Pyeongtaek-si (KR)

(72) Inventors: Woo Young Park, Anyang-si (KR); Ja Hyun Koo, Yongin-si (KR); Chang Hee Han, Pyeongtaek-si (KR); Sung Eun Lee, Osan-si (KR); Sung Ho Jeon, Seosan-si (KR); Byoung Guk Son, Osan-si (KR); Sung Ho Roh, Yongin-si (KR); Yeong Taek Oh, Osan-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/116,842

(22) Filed: Dec. 9, 2020

(65) Prior Publication Data

US 2021/0170436 A1 Jun. 10, 2021

(30) Foreign Application Priority Data

Dec. 10, 2019 (KR) .................. 10-2019-0163843
Dec. 10, 2019 (KR) .................. 10-2019-0163844

(51) Int. Cl.
*B05C 13/02* (2006.01)
*B05C 5/02* (2006.01)

(52) U.S. Cl.
CPC .............. *B05C 5/02* (2013.01); *B05C 13/02* (2013.01)

(58) Field of Classification Search
None
See application file for complete search history.

(56) References Cited

U.S. PATENT DOCUMENTS

| 5,226,383 | A | * | 7/1993 | Bhat | C23C 16/4584 118/500 |
|---|---|---|---|---|---|
| 2002/0090454 | A1 | * | 7/2002 | Paisley | C23C 16/45519 427/248.1 |
| 2003/0168174 | A1 | * | 9/2003 | Foree | C23C 16/4584 156/345.51 |
| 2003/0188687 | A1 | * | 10/2003 | Paisley | C23C 16/4584 118/730 |
| 2004/0231599 | A1 | * | 11/2004 | Schwambera | C30B 25/12 118/728 |

(Continued)

FOREIGN PATENT DOCUMENTS

| TW | M457014 U1 | 7/2013 |
|---|---|---|
| TW | 201732079 A | 9/2017 |

(Continued)

*Primary Examiner* — Charles Capozzi
(74) *Attorney, Agent, or Firm* — William Park & Associates Ltd.

(57) ABSTRACT

The present invention provides a substrate processing apparatus including: a process chamber having a process space in which a substrate is processed; a substrate support including a susceptor having a plurality of pocket grooves recessed in a circumferential direction from a top surface with a circular plate shape so that the substrate is seated, a shaft configured to rotate the susceptor, and a satellite seated in the pocket groove and on which the substrate is seated; and a gas injection unit disposed at an upper portion of the process chamber to face the substrate support, thereby injecting a process gas toward the substrate support.

10 Claims, 16 Drawing Sheets

(56) References Cited

U.S. PATENT DOCUMENTS

| | | | |
|---|---|---|---|
| 2006/0054091 A1* | 3/2006 | Speciale | H01L 21/6838 118/730 |
| 2017/0218514 A1 | 8/2017 | Kato et al. | |
| 2017/0278730 A1 | 9/2017 | Tandou et al. | |
| 2018/0037990 A1 | 2/2018 | Kato | |
| 2018/0233354 A1* | 8/2018 | Masuda | H01L 21/673 |

FOREIGN PATENT DOCUMENTS

| | | |
|---|---|---|
| TW | 201801130 A | 1/2018 |
| TW | 201816174 A | 5/2018 |

* cited by examiner

FIG. 19

|  | Start | Rotation | Stop |
|---|---|---|---|
| Lifting gas flow rate | 30~50 sccm | 30~300 sccm | Max~0 |
| Movement gas flow rate | 0 sccm | ~Max | 0 sccm |
| Satellite height | 0 → 0.2 mm | 0.2 mm | 0.3 → 0 mm |
| Satellite rotation | Stop (floating) | Rotation | Stop after speed reduction |
| Lifting gas flow rate | | | |
| Movement gas flow rate | | | |

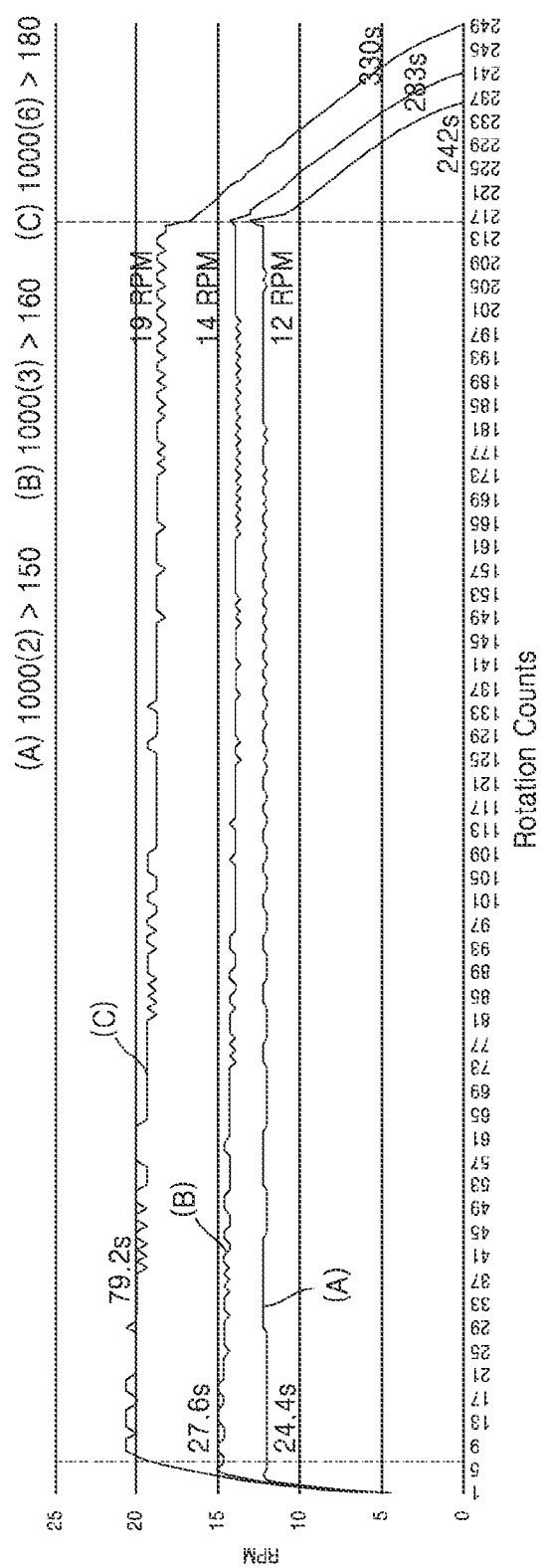

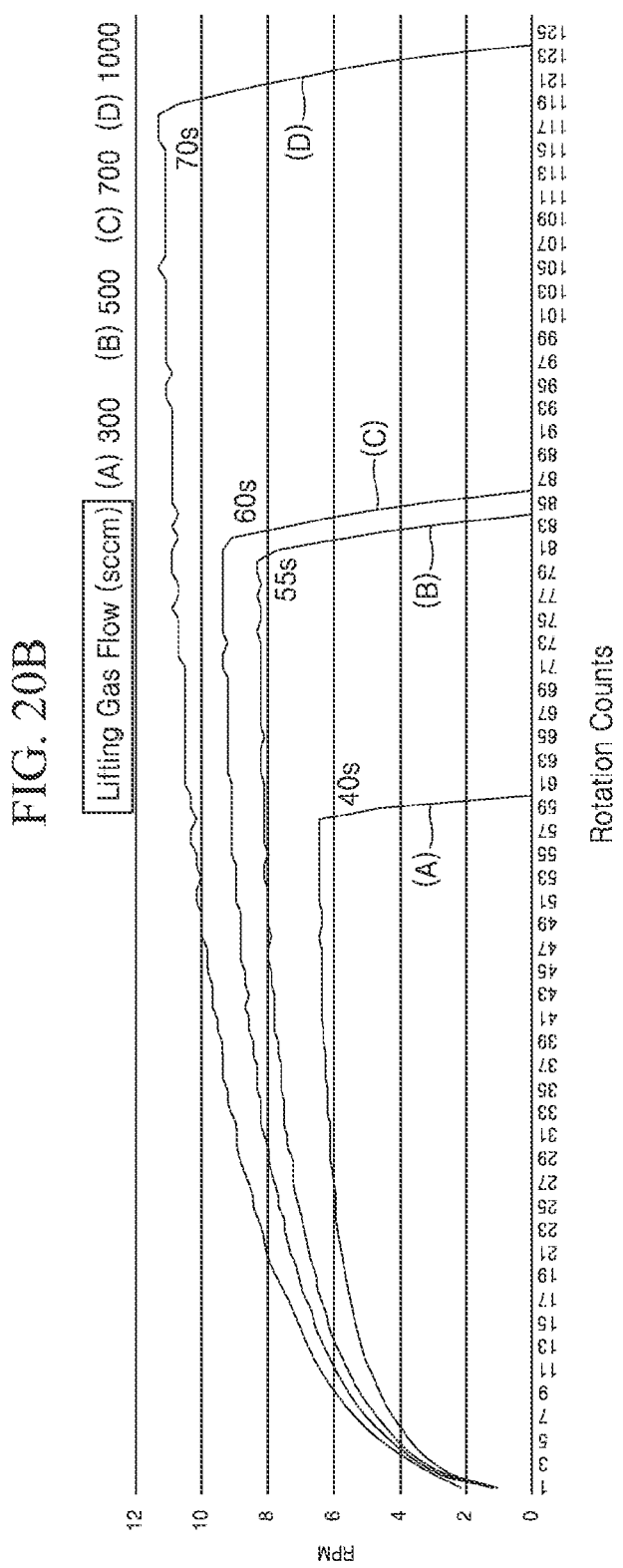

SUBSTRATE PROCESSING APPARATUS

CROSS-REFERENCE TO RELATED APPLICATIONS

This U.S. non-provisional patent application claims the benefit and priority to Korean Patent Application No. 10-2019-0163843, filed on Dec. 10, 2019, and Korean Patent Application No. 10-2019-0163844, filed on Dec. 10, 2019, the entire contents of which are hereby incorporated by reference.

BACKGROUND

The present disclosure herein relates to a substrate processing apparatus, and more particularly, to a substrate processing apparatus for depositing a thin-film on a substrate.

In general, all sorts of processes are performed in a substrate processing apparatus including a process chamber having a vacuum atmosphere in order to manufacture a semiconductor device, a display device, or a solar cell. For example, a process of loading a substrate to a process chamber and depositing or etching a thin-film may be performed. Here, the substrate may be supported by a substrate support installed in the process chamber, and a process gas may be injected through a shower head installed at an upper portion of the substrate support to face the substrate support.

Here, rotation of a susceptor on which the substrate is seated and rotation of the substrate seated on the susceptor are required for uniform growth of the thin-film on the substrate. That is, the growth of the thin-film may be substantially uniformly implemented by the rotation while the substrate is exposed to a reaction gas. To this end, the substrate processing apparatus may rotate the substrate such that the satellite of which a top surface supporting the substrate is seated in a pocket groove, a gas groove is defined in a top surface of the pocket groove in a semi-circular direction with respect to a central shaft, and the satellite is floated and rotated through a flow of the injected gas.

SUMMARY

However, the substrate processing apparatus of the related art may not stably control lifting and rotation when the satellite is stopped after the process. The satellite is continuously rotated for a predetermined time by rotational inertia. although gas supply that provides a rotation force is blocked after the process is finished, and as the satellite floated by rotation is seated on a bottom surface, particles are generated because the satellite in a non-stopped state is seated on the bottom surface.

The present disclosure provides a substrate processing apparatus capable of: stably performing floating and rotation of the satellite by individually controlling lifting and rotation movement of the satellite seated on the pocket groove of the substrate support during a process of processing the substrate; and reducing particles by defining a groove to apply a flow pressure of the gas in an opposite direction of a rotation direction of the satellite between the satellite and a bottom surface of the pocket groove and applying a pressure in a reverse rotational direction to further quickly stop the satellite when the satellite is stopped. However, this is merely illustrative, and thus the scope of the present disclosure is not limited thereto.

An embodiment of the present invention provides a substrate processing apparatus including: a process chamber having a process space in which a substrate is processed; a substrate support including a susceptor having a plurality of pocket grooves recessed in a circumferential direction from a top surface with a circular plate shape so that the substrate is seated, a shaft configured to rotate the susceptor, and a satellite seated in the pocket groove and on which the substrate is seated; and a gas injection unit disposed at an upper portion of the process chamber to face the substrate support, thereby injecting a process gas toward the substrate support. Here, the susceptor includes: a lifting gas hole defined at a central portion of the pocket groove to float the satellite, thereby injecting a lifting gas introduced through a first lifting gas flow path defined in the susceptor; and a movement gas hole defined at an edge of the pocket groove to rotate the satellite floated in the pocket groove, thereby injecting a movement gas introduced through a first movement gas flow path defined in the susceptor, and the shaft includes: a second lifting gas flow path configured to transfer the lifting gas supplied from the outside to the first lifting gas flow path; and a second movement gas flow path configured to transfer the movement gas supplied from the outside to the first movement gas flow path.

In an embodiment, the first lifting gas flow path connected to the lifting gas hole defined in each of the plurality of pocket grooves may be connected to the single second lifting gas flow path.

In an embodiment, the second lifting gas flow path may be provided in plurality so that a plurality of the second lifting gas flow paths are connected to the first lifting gas flow paths, respectively, connected to the lifting gas hole defined in each of the plurality of pocket grooves.

In an embodiment, a position fixing projection may be disposed at the central portion of the pocket groove of the susceptor, the lifting gas hole may be defined around the position fixing projection, and a projection groove to which at least a portion of the position fixing projection is inserted may be defined in a bottom surface of the satellite.

In an embodiment, the satellite may include a rotation pattern part configured to transmit a rotation force to the satellite by the movement gas injected from the movement gas hole and disposed along an edge of a bottom surface corresponding to the movement gas hole.

In an embodiment, the movement gas hole may be inclined to the bottom surface of the pocket groove.

In an embodiment, the shaft may include: a plurality of shaft ring grooves that are ring-shaped cut portions obtained by cutting a side surface of the shaft by a predetermined depth in a circumferential direction of the shaft and spaced apart from each other in a longitudinal direction of the shaft; and a plurality of shaft taps defined at one side of the plurality of shaft ring grooves. Here, the second lifting gas flow path may be communicated with the first lifting gas flow path at a top surface of the shaft to supply the lifting gas to the susceptor and pass through from the top surface to a bottom surface of the shaft, and each of the second movement gas flow paths may be communicated with the first movement gas flow path at the top surface of the shaft to supply the movement gas to the susceptor and connected from the top surface of the shaft to each of the shaft ring grooves.

In an embodiment, the substrate processing apparatus may further include a magnetic fluid seal configured to surround a peripheral portion of the shaft in order to seal the shaft in a rotation manner. Here, the magnetic fluid seal may include a plurality of third movement gas flow paths passing through from an inner surface to an outer surface of the magnetic fluid seal and communicated with the second movement gas flow paths, respectively, and each of the third movement gas flow paths may be connected to a movement gas supply unit through a pipe.

In another embodiment, the substrate processing apparatus may further include a flow groove defined in the bottom surface of the pocket groove so that the lifting gas injected from the lifting gas hole flows in a direction opposite to a rotation direction of the satellite.

In another embodiment, the flow groove may extend with a spiral shape in a direction from the lifting gas hole to the edge of the pocket groove.

In another embodiment, the flow groove may have a bottom surface that is inclined upward along a flow direction of the lifting gas so that a rotation force transmitted to the satellite increases by inducing a fast flow speed of the lifting gas such that a cross-section thereof gradually decreases in the flow direction of the lifting gas.

In another embodiment, the satellite may include a rotation pattern part configured to transmit a rotation force to the satellite by the movement gas injected from the movement gas hole and disposed along an edge of a bottom surface corresponding to the movement gas hole.

In another embodiment, the movement gas hole may be inclined to the bottom surface of the pocket groove.

In another embodiment, the first lifting gas flow path connected to the lifting gas hole defined in each of the plurality of pocket grooves may be connected to the single second lifting gas flow path.

In another embodiment, the second lifting gas flow path may be provided in plurality so that a plurality of the second lifting gas flow paths are connected to the first lifting gas flow paths, respectively connected to the lifting gas hole defined in each of the plurality of pocket grooves.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 19 is a table showing a lifting gas flow rate and a movement gas flow rate when the substrate processing apparatus according to another embodiment of the present invention is driven; and FIGS. 20A and 20B are graphs comparing a relationship between a rotation speed and a rotation count of a substrate according to the present invention and the related art.

DETAILED DESCRIPTION

Figure 1:
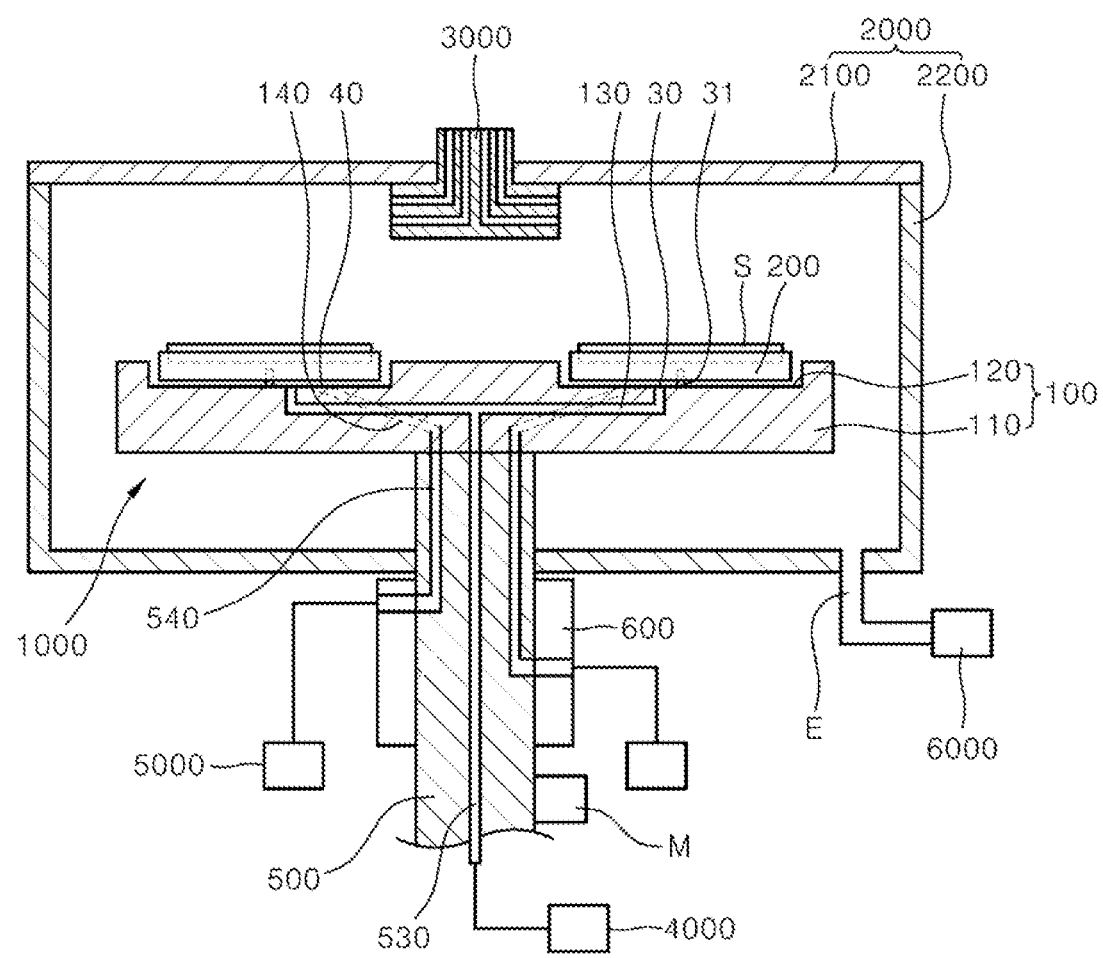
FIG. 1 is a schematic cross-sectional view illustrating a substrate processing apparatus according to an embodiment of the present invention.

Hereinafter, preferred embodiments of the present disclosure will be described in detail with reference to the accompanying drawings.

The exemplary embodiments of the present disclosure may, however, be embodied in many different forms and should not be construed as being limited to the embodiments set forth herein; rather, these embodiments are provided so that those skilled in the art thoroughly understand the present disclosure. Rather, these embodiments are provided so that this disclosure will be thorough and complete, and will fully convey the scope of the present disclosure to those skilled in the art. Also, in the figures, a thickness or dimension of each of layers is exaggerated for clarity of illustration.

Hereinafter, the preferred embodiments of the present invention will be described with sectional views as ideal exemplary views of the inventive concept. In the drawings, for example, according to the manufacturing technology and/or tolerance, the modification of the illustrated shape may be expected. Thus, the exemplary embodiments of the present disclosure must not be interpreted to be limited by a particular shape that is illustrated in the drawings and must include a change in the shape occurring, for example, during manufacturing.

Figure 2:
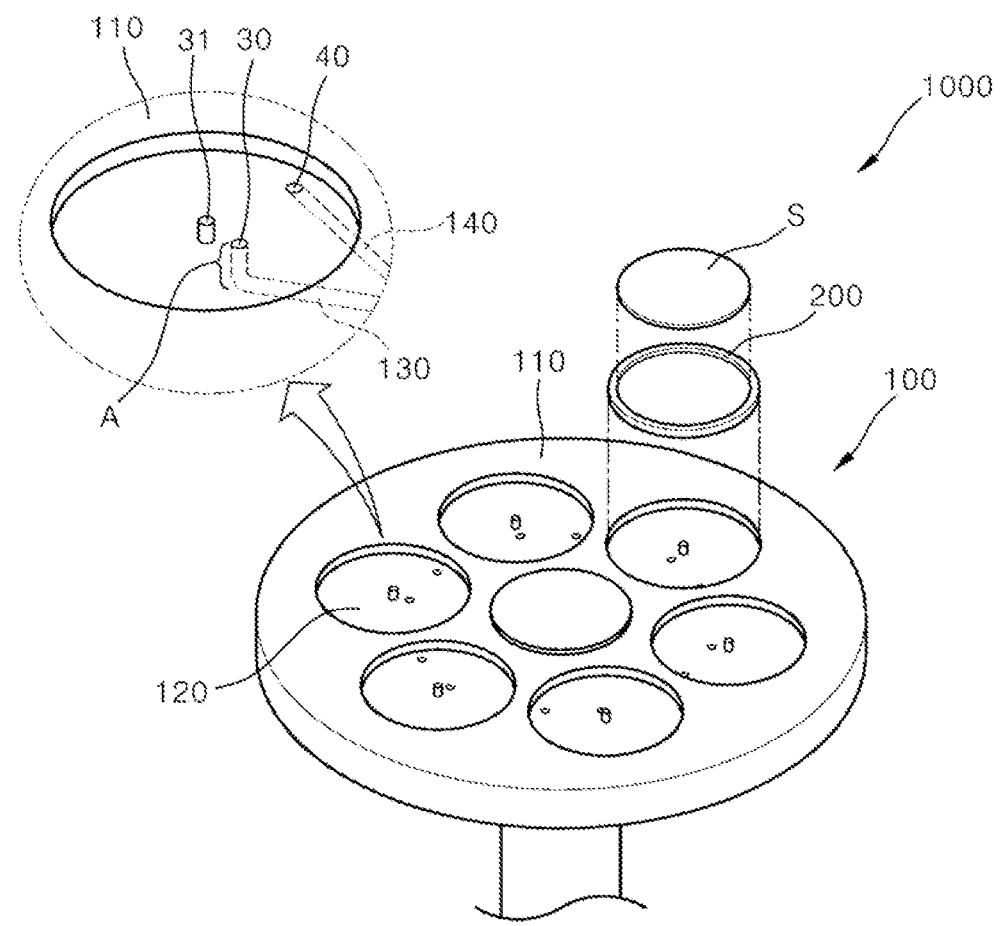
FIG. 2 is a schematic perspective view illustrating a substrate support of the substrate processing apparatus in FIG. 1.

FIG. 1 is a schematic cross-sectional view illustrating a substrate processing apparatus according to an embodiment of the present invention, FIG. 2 is a schematic perspective view illustrating a substrate support 1000 of the substrate processing apparatus in FIG. 1, and FIGS. 3A, 3B, and 4 are cross-sectional views illustrating a first lifting gas flow path 130 and a first movement gas flow path 140, which extend from a pocket groove 120 in FIG. 2.

Firstly, as illustrated in FIG. 1, a processing apparatus according to an embodiment of the present invention may include a substrate support 1000, a process chamber 2000, and a gas injection unit 3000.

As illustrated in FIGS. 1 and 2, the substrate support 1000 may include a susceptor 100, a satellite 200, a shaft 500, and a magnetic fluid seal 600, and a detailed description thereof will be described later.

As illustrated in FIG. 1, the process chamber 2000 may include a chamber body 2200 defining a process space in which a substrate S is processed. The process space having a circular or rectangular shape may be formed in the chamber body 2200. In the process space, a process of depositing a thin-film on the substrate S supported by the substrate support 1000 installed in the process space or a process of etching the thin-film may be performed.

Also, a plurality of exhaust ports E having a shape surrounding the substrate support 1000 may be installed at a lower side of the chamber body 2200. Each of the exhaust ports E may be connected to a main vacuum pump 6000 installed outside the process chamber 2000 through an exhaust pipe. Also, the exhaust port E may suction air in the process space of the process chamber 2000 to exhaust all sorts of process gases in the process space or form a vacuum atmosphere in the process space.

Although not shown, a gate that is a passage through which the substrate S is loaded to or unloaded from the process space may be defined in a side surface of the chamber body 2200. In addition, the process space of the chain her body 2200 having an opened upper portion may be closed by a top lid 2100.

As illustrated in FIG. 1, the substrate support 1000 may be provided in the process space of the process chamber 2000 to support the substrate S and installed to be rotated with respect to a central shaft of the process chamber 2000. For example, the substrate support 1000 may be a substrate support structure including a susceptor or a table capable of supporting the substrate S.

Here, the gas injection unit 3000 may be formed at an upper central portion of the process chamber 2000 to face the substrate support 1000 and inject the process gas toward the substrates disposed therebelow. Also, the gas injection unit 3000 may be formed at an upper portion of the process chamber 2000 to face the substrate support 1000 and inject the process gas so that the process gas is dropped toward a plurality of substrates S disposed therebelow.

As illustrated in FIG. 1, the substrate processing apparatus of the present invention may be connected with a lifting gas supply unit 4000 through lifting gas flow paths. The lifting gas supply unit 4000 may supply a lifting gas introduced to a plurality of pocket groove 120 and control a flow rate of the lifting gas supplied to the substrate support 1000.

During a process of processing the substrate, the lifting gas may be supplied from the lifting gas supply unit 4000 to one second lifting gas flow path 530. Thereafter, the supplied lifting gas may be supplied to a plurality of satellites 200 through a plurality of first lifting gas flow paths 130. Thus, the plurality of satellites 200 seated on a top surface of the susceptor 100 may be sufficiently floated before the plurality of satellites 200 is rotated.

Also, as illustrated in FIG. 1, the substrate processing apparatus of the present invention may be connected with a movement gas supply unit 5000 through movement gas flow paths. The movement gas supply unit 5000 may individually supply an introduced movement gas to a plurality of pocket grooves 120 defined in the substrate support 1000. Thus, a flow rate of the movement gas supplied to the plurality of pocket grooves 120 may be individually controlled.

Even when one satellite 200 is deviated from the pocket groove 120 of the susceptor 100 while a process of processing the plurality of substrates S is performed, the process may be performed and stopped in a state in which the satellite rotated in another pocket groove 120 is not affected.

That is, the substrate processing apparatus of the present invention rotates the plurality of satellites 200 by supplying the lifting gas so that the plurality of satellites 200 are floated and then supplying the movement gas. The substrate processing apparatus of the present invention may individually perform floating and rotation movement of the plurality of satellites 200 by sequentially supplying separated gases for lifting and rotation, may control the plurality of satellites 200 to be rotated at a high speed according to a flow rate of the movement gas, and may exhibit an effect of reducing generation of particles.

Hereinafter, the substrate support 1000 of the substrate processing apparatus of the present invention will be described in more detail.

As illustrated in FIGS. 1 and 2, the substrate support 1000 include the susceptor 100, the satellite 200, the shaft 500, and the magnetic fluid seal 600.

The susceptor 100 may have a circular plate shape and be installed in the process space of the process chamber 2000, and the plurality of pocket grooves 120 may be defined in a top surface of the susceptor 100 so that the plurality of substrates are seated.

Specifically, the susceptor 100 may include: a susceptor body 110 in which the plurality of pocket grooves 120 are radially arranged with equal angles with respect to a rotation shaft on the top surface thereof so that the plurality of substrates S are processed at once; and a plurality of pocket grooves 120 defined in a. top surface of the susceptor body 110 and having a shape corresponding to the plurality of substrates.

In the susceptor 100, a lifting gas hole 30 and a movement gas hole 40 may be defined in a bottom surface of the pocket groove 120. and a first lifting gas flow path 130, which passes through from the lifting gas hole 30 to a bottom surface of the susceptor 100, and a first movement gas flow path 140 may be defined.

The lifting gas hole 30 may be defined in a central portion of each of the plurality of pocket grooves 120. Here, the lifting gas hole 30 may be formed such that at least one section of the first lifting gas flow path 130 is perpendicular to the susceptor 100 so that the plurality of satellites 200 are floated by the supplied lifting gas. That is, the lifting gas supplied from the first lifting gas flow path 130 may be supplied in a direction perpendicular to the satellite 200.

Figure 3A:
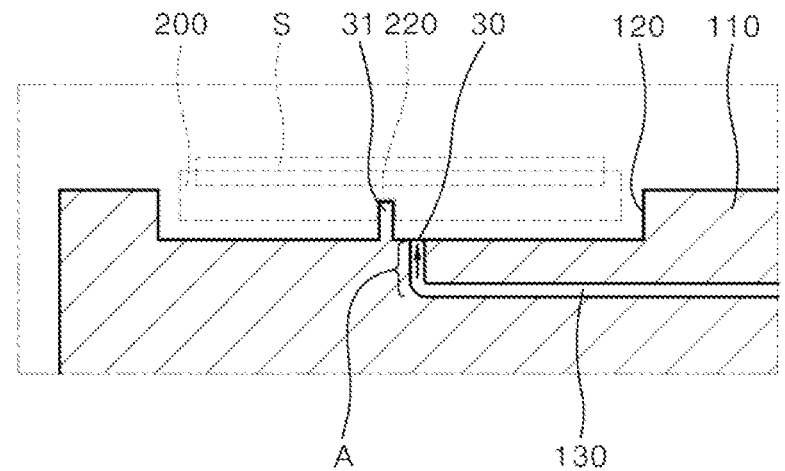
FIG. 3A is a cross-sectional view illustrating a first lifting gas flow path extending from a pocket groove of the substrate support according to an embodiment of the present invention.

For example, as illustrated in FIGS. 2 and 3A, six pocket grooves 120 may be spaced the same distance from each other with equal angles with respect to the rotation shaft at an upper portion of the susceptor body 110. Here, a position fixing projection 31 may be formed at the central portion of each of the pocket grooves 120.

More specifically, the position fixing projection 31 having a cylindrical shape may protrude from the central portion of the pocket groove 120. Also, a projection groove 220 to which at least a portion of the position fixing projection 31 is inserted may be defined in a central axis of a bottom surface of each of the plurality of satellites 200.

The position fixing projection 31 may be coupled with the satellite 200 seated in the susceptor 100 and fix a position of the satellite 200 when the satellite 200 is rotated.

Thus, as the plurality of satellites 200 are floated and rotated with respect to the projection groove 220 to which the position fixing projection 31 is inserted, the rotation movement of the plurality of satellites 200 may be stably performed.

Although not shown, the susceptor body may heat the substrate S seated in the pocket groove 120 at a process temperature at which a process of depositing or etching a thin-film is performed by including a heater for heating the substrate S seated in the pocket groove 120 at the process temperature.

The lifting gas hole 30 may be defined around the position fixing projection 31, i.e., a peripheral portion adjacent to the position fixing projection 31 in the central portion of the pocket groove 120, so that the satellite 200 is floated in the pocket groove 120.

The lifting gas hole 30 may be connected with the first lifting gas flow path 130 defined in the susceptor 100.

The first lifting gas flow path 130 may pass through from the bottom surface of the susceptor 100 to each of the plurality of lifting gas holes 30. Here, the first lifting gas flow path 130 may be formed such that a plurality of flow paths each extending from a central portion of the bottom surface of each of the pocket grooves 120 are coupled and communicated at a central portion of the bottom surface of the susceptor 100.

That is, the first lifting gas flow path 130 is a flow path divided into a several branches from a lower portion of the susceptor 100. For example, the lifting gas may be introduced from one inlet defined in the bottom surface of the susceptor 100 and supplied to each of the plurality of lifting gas holes 30 defined in the plurality of pocket grooves 120.

Also, a vertical section A that is a section from the lifting gas hole 30 to a portion spaced a predetermined length therefrom may be perpendicular to the satellite 200. Thus, as the lifting gas is introduced perpendicularly to the satellite 200 from the first lifting gas flow path 130, the lifting gas may stably float the satellite 200.

All of the lifting gases may be introduced to each of the first lifting gas flow paths 130 through the shaft 500. The introduced lifting gas is supplied from each of the lifting gas holes 30 to each of the satellites 200.

Here, the lifting gas may provide a pressure for floating the satellite 200, and an inert gas such as a nitrogen gas may he used as the lifting gas.

Figure 3B:
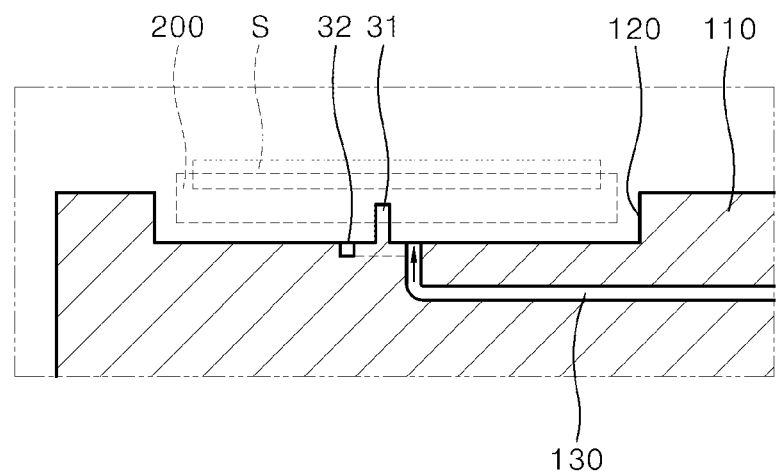
FIG. 3B is a cross-sectional view illustrating a first lifting gas flow path extending from a pocket groove of a substrate support according to another embodiment of the present invention.

Also, as illustrated in FIG. 3B, the lifting gas hole 30 may be connected to a lifting gas path 32 having a ring shape having a predetermined width and disposed at a peripheral portion of the position fixing projection 31. That is, the lifting gas hole 30 may be connected to the lifting gas path 32 formed with a tube shape at the peripheral portion of the position fixing projection 31 having the cylindrical shape in a predetermined section from one portion of the first lifting gas flow path 130 to an outer portion of the lifting gas hole 30.

Thus, when the lifting gas is introduced to the lifting gas path 32, the plurality of satellites 200 may be stably floated as a pressure in the form of a tube is applied from the lifting gas to a lower portion of each of the plurality of satellites 200.

Each of a plurality of movement gas holes 40 is defined at one side of each of the plurality of pocket grooves 120. Here, at least one portion of the first movement gas flow path 140 may he inclined to the susceptor 100 so that the plurality of movement gas holes 40 supply the movement gas to rotate the plurality of satellites 200. That is, the first movement gas flow path 140 may be inclined in a direction parallel to a tangent line of the satellite 200 from the bottom surface of the pocket groove 120 to a predetermined distance inside the susceptor 100 so that the movement gas injected from the bottom surface of the pocket groove 120 is introduced in a tangential direction of the satellite 200 to rotate the satellite 200.

Figure 4:
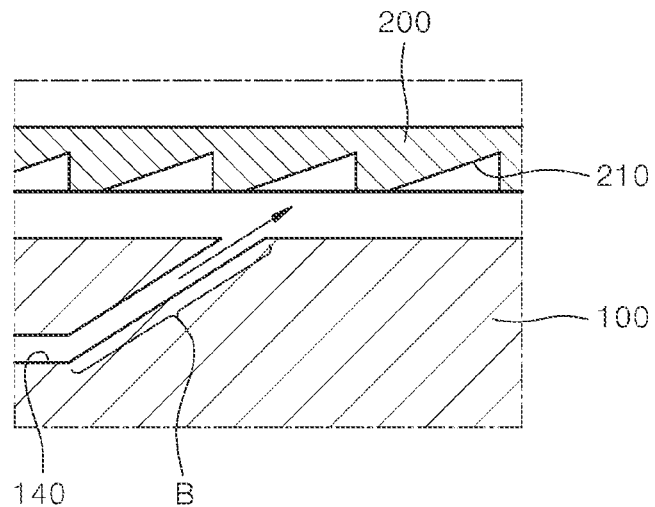
FIG. 4 is a cross-sectional view illustrating a first movement gas flow path extending from a pocket groove in FIG. 2.

For example, as illustrated in FIGS. 2 and 4, the six pocket grooves 120 may be formed with equal angles with respect to the rotation shaft at the upper portion of the susceptor body 110. Here, each of the movement gas holes 40 may be formed at a point spaced a predetermined distance from a center of each of the pocket grooves 120. The movement gas holes 40 may be connected to the plurality of first movement gas flow paths 140, respectively, which are defined in the susceptor 100.

Gases having a predetermined pressure may be introduced from the plurality of movement gas holes 40. The movement gas may be introduced to a lower peripheral portion of the satellite 200 so that the satellite 200 floating at an upper portion of the pocket groove 120 by the lifting gas is rotated in the pocket groove 120 instead of being deviated from the pocket groove 120. Here, the satellite 200 in a floating state may be rotated by the pressure of the introduced movement gas.

The first movement gas flow path 140 may be connected from a top surface of the shaft 500 to the plurality of movement gas holes 40 through the inside of the susceptor 100. Also, an inclined section B extending a predetermined distance from the plurality of movement gas holes 40 may be formed in a tangential direction with respect to the satellite 200. Thus, as the movement gas is introduced in the tangential direction to the satellite 200 from the first movement gas flow path 140, the movement gas may rotate the plurality of the satellites 200.

As illustrated in FIGS. 1 and 2, the satellite 200 may have a circular plate shape seated in the pocket groove so that the satellite 200 is rotated in the floating state by the pressure of the gas supplied through the susceptor 100 to rotate each of the substrates S seated on the top surface thereof.

As illustrated in FIGS. 2 and 3A, the satellite 200 is floated by the pressure of the lifting gas supplied through the susceptor 100 and is rotated by the movement gas to rotate the substrate S seated on the top surface thereof.

Figure 5:
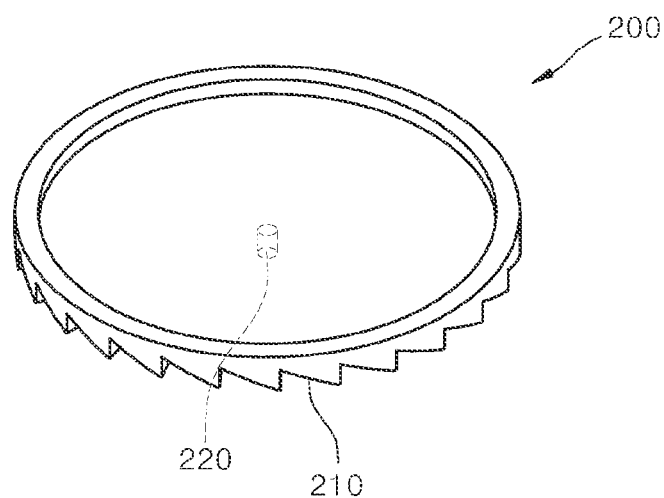
FIG. 5 is a perspective view illustrating a satellite according to an embodiment of the present invention.

FIG. 5 is a perspective view illustrating the satellite 200 according to an embodiment of the present invention.

As illustrated in FIG. 5, each of the plurality of satellites 200 may include a rotation pattern part 210 at an edge of a rear surface thereof to collide with the movement gas introduced from the first movement gas flow path 140. Here, the rotation pattern part 210 may be formed on the rear surface of the satellite 200 in correspondence to the movement gas hole 40 defined in the pocket groove 120.

As illustrated in FIGS. 4 and 5, the rotation pattern part 210 may be formed as a groove having a windmill shape from a point spaced a predetermined distance from a central axis of the rear surface of each of the plurality of satellites 200. Thus, the satellite 200 may be rotated by a pressure generated when the gas supplied from the movement gas hole 40 passes the inclined section B through the first movement gas flow path 140 and collides with a stepped portion having a. groove shape. Here, the stepped portion having a groove shape may be the rotation pattern part 210.

A rotation pattern part 210 according to another embodiment may have a wall shape protruding from a point spaced a predetermined distance from the central axis of the rear surface of each of the plurality of satellites 200 in a direction of a diameter line thereof. Also, the rotation pattern part 210 may be provided in plurality along a circumference of each of the plurality of satellites 200. Thus, the plurality of satellites 200 may be rotated by a pressure generated when the gas supplied from the plurality of movement gas holes 40 passes the inclined section B through the first movement gas flow path 140 and collides with the protruding portion.

However, the embodiment of the present invention is not limited to the shape of the rotation pattern part 210 in FIG. 5. For example, the rotation pattern part 210 may have various shapes and widths according to a rotation force required for the plurality of satellites 20.

Figure 6:
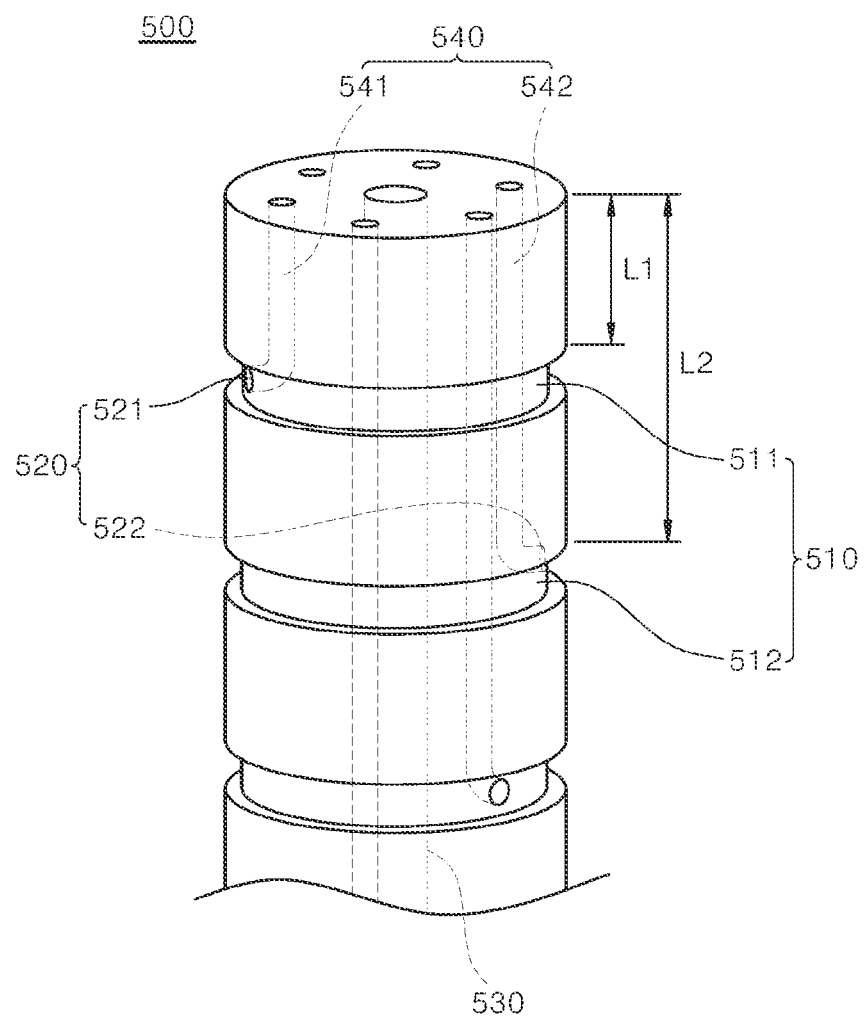
FIG. 6 is a perspective view illustrating a shaft of the substrate support according to an embodiment of the present invention.

FIG. 6 is a perspective view illustrating the shaft 500 of the substrate support according to an embodiment of the present invention.

As illustrated in FIG. 6, the shaft 500 may be connected to the susceptor 100 and receive a rotation force from a driving unit M to rotate the susceptor 100, thereby revolving the plurality of substrates S. The shaft 500 may have a central shaft coincided with the rotation shaft disposed at the lower portion of the susceptor 100 to support the susceptor 100 and be rotated in conjunction with the susceptor 100 as the driving unit M transmits a power for rotating the susceptor 100 thereto.

Also, the lifting gas flow paths and the movement gas flow paths may be defined in the shaft 500.

The shaft 500 may include a plurality of shaft ring grooves 510, a plurality of shaft taps 520, a second lifting gas flow path 530, and a plurality of second movement gas flow paths 540.

Each of the plurality of shaft ring grooves 510 may be formed by a cut portion having a ring shape obtained by a side surface of the shaft 500 is cut by a predetermined depth in a circumferential direction of the shaft. The plurality of shaft ring grooves 510 may he spaced apart from each other in a longitudinal direction of the shaft 500.

Each of the plurality of shaft taps 520 may he formed at one side of each of the plurality of shaft ring grooves 510 so that the plurality of shaft taps 520 are connected to the plurality of second movement gas flow paths 540, respectively.

The shaft ring groove 510 may be formed as a groove recessed a predetermined depth inward from an outer surface of the shaft 500 along a circumference of the shaft 500 Here, the plurality of shaft ring grooves 510 may be formed as many as the number of the plurality of pocket grooves 120 so that the shaft tap 520 defined in the side surface of the groove is individually connected to the plurality of pocket grooves 120.

As peripheral portions of the plurality of shaft ring grooves 510 are sealed by the magnetic fluid seal 600, the plurality of shaft ring grooves 510 may serve as a flow path surrounding the circumference of the shaft 500 and through which gases flow.

As the plurality of shaft taps 520 are formed in all of the plurality of shaft ring grooves 510, the plurality of shaft taps 520 may be communicated with the plurality of pocket grooves 120, respectively.

The shaft 500 may include the second lifting gas flow path 530 communicated with the first lifting gas flow path 130 and passing through the shaft 500 from a top surface to a bottom surface thereof and the second movement gas flow paths 540 communicated with the first movement gas flow paths 140, respectively, and passing through the shaft 500 from the top surface to the side surface thereof.

The second lifting gas flow path 530 may be communicated with the first lifting gas flow path 130 at the top surface of the shaft 500 in order to supply the lifting gas to the susceptor 100 and pass through the shaft from the top surface to the bottom surface thereof.

As illustrated in FIG. 1, the second lifting gas flow path 530 may be formed at an inner central portion of the shaft 500 and connected to the lifting gas supply unit 4000 disposed at the outside. That is, the second lifting gas flow path 530 is a flow path transferring the gas received from the lifting gas supply unit 4000 to the first lifting gas flow path 130.

Each of the second movement gas flow paths may be communicated with each of the first movement gas flow paths 140 at the top surface of the shaft 500 to supply the movement gas to the susceptor 100. The second movement gas flow path may be connected from the top surface of the shaft 500 to the shaft ring groove 510.

The second movement gas flow path 540 may be provided in plurality in the shaft 500. Each of the plurality of second movement gas flow paths 540 may have one side connected to each of the plurality of first movement gas flow path 140 and the other side connected to each of the shaft taps 520. That is, the second movement gas flow paths 540 may be flow paths transferring the gas supplied from the movement gas supply unit 5000 through the shaft tap 520 to plurality of first movement gas flow paths 140.

For example, as illustrated in FIGS. 2 and 6, the second movement gas flow path 540 may include a second-first movement gas flow path 541 and a second-second movement gas flow path 542. Here, the second-first movement gas flow path 541 may have one side connected to one of the plurality of first movement gas flow paths 140 defined in the susceptor 100 and the other side connected to the first shaft tap 521 defined at one side of the first shaft ring groove 511.

Also, the second-second movement gas flow path 542 may have one side connected to the other of the plurality of first movement gas flow paths 140 defined in the susceptor 100 and the other side connected to the second shaft tap 522 defined at the other side of the second shaft ring groove 512.

Here, the second-first movement gas flow path 541 and the second-second movement gas flow path 542 are connected to the plurality of shaft ring grooves 510 respectively, which are defined at different heights. Specifically, the second-first movement gas flow path 541 may be connected to the first shaft ring groove 511 spaced a first spaced distance L1 from the top surface of the shaft 500. Also, the second-second movement gas flow path 542 may be connected to the second shaft ring groove 512 spaced a second spaced distance L2 greater than the first spaced distance L1 from the top surface of the shaft 500. That is, the second-second movement gas flow path 542 may be greater in length than the second-first movement gas flow path 541.

As described above, inner spaces formed between the plurality of pocket grooves 120 and the plurality of satellites 200 may be individually connected to the movement gas flow paths.

Figure 7:
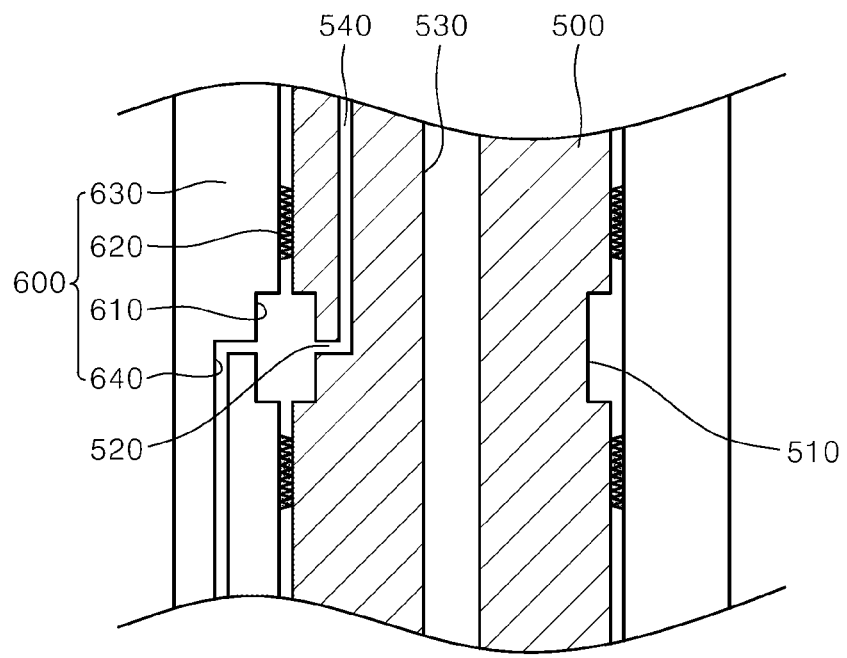
FIG. 7 is a schematic cross-sectional view illustrating connection between a shaft and a magnetic fluid seal according to an embodiment of the present invention.

FIG. 7 is a schematic cross-sectional view illustrating connection between the shaft 500 and the magnetic fluid seal 600 according to an embodiment of the present invention.

As illustrated in FIGS. 1 and 7, the substrate processing apparatus according to an embodiment of the present invention may include the magnetic fluid seal 600 coupled to and surrounding the shaft 500 to seal the shaft 500 in a rotation manner, Here, the second movement gas flow path 540 may be connected to the third movement gas flow path 640 formed from the side portion of the shaft 500 to the inside of the magnetic fluid seal 600 and the movement gas supply unit 5000 through a pipe.

The magnetic fluid seal 600 may include a seal groove 610, a magnetic fluid 620, a seal body 630, and the third movement gas flow path 640.

The magnetic fluid seal 600 is a fluid O-ring capable of sealing a space by using the magnetic fluid 620. The magnetic fluid 620 is prepared by distributing magnetic nano-particles in a liquid. The magnetic fluid 620 has a property in which only a portion affected by a magnetic field soars sharply along a magnetic line when a magnetic field is applied while not moving at a normal state like other liquids. Thus, the inner space of the seal may be sealed by applying a magnetic field to the magnetic fluid seal 600 including the above-described magnetic fluid 620.

As the plurality of third movement gas flow paths 640 are defined in the seal body 630, an inert gas such as a nitrogen gas may flow through the third movement gas flow path 640.

The seal groove 610 may be defined at a side surface of the magnetic fluid seal 600 so that the second movement gas flow path 540 is connected with the third movement gas flow path 640.

The plurality of third movement gas flow paths 640 may pass through the magnetic fluid seal 600 from an inner surface to an outer surface thereof and be communicated with the plurality of second movement gas flow paths 540, respectively. Each of the plurality of third movement gas flow paths 640 may be connected to the movement gas supply unit 5000 through the pipe.

The magnetic fluid 620 may be formed at an upper portion and a lower portion of the seal groove 610 and maintain a blocked state, from the outside, of the second movement gas flow path 540, the third movement gas flow path 640, and the seal groove 610 connected to the second movement gas flow path 540 and the third movement gas flow path 640.

Specifically, the shaft ring groove 510 having a ring shape may be always communicated with the seal groove 610 even when the shaft 500 is rotated as the shaft ring groove 510 is formed at an outer circumference of the rotating shaft 500. Thus, the second movement gas flow path 540 formed in the rotating shaft 500 may be connected to the third movement gas flow path 640 of the magnetic fluid seal 600 in a fixed state.

Here, the magnetic fluid 620 may be formed at a portion at which the shaft 500 and the magnetic fluid seal 600 contact and cause friction in addition to the portion at which the second movement gas flow 540 is connected with third movement gas flow path 640. The magnetic fluid 620 may seal the movement gas flow path by receiving a magnetic field when the shaft 500 is rotated. Thus, the magnetic fluid 620 may reduce generation of abrasion caused by friction, heat, and vibration even when the shaft 500 is rotated. Thus, the process of processing the substrates may be further effectively performed.

Figure 8:
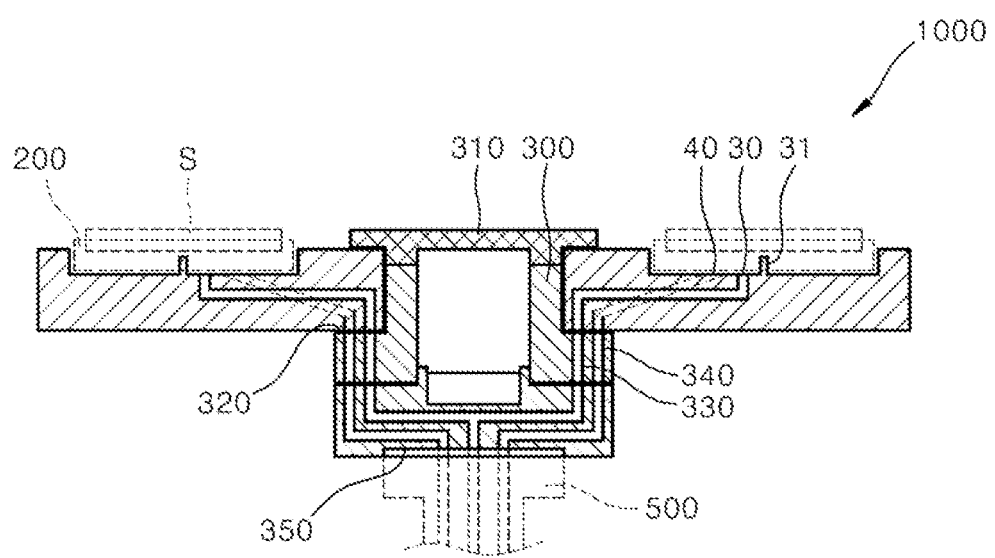
FIG. 8 is a schematic cross-sectional view illustrating a disc clamp of the substrate support according to an embodiment of the present invention.

FIG. 8 is a schematic cross-sectional view illustrating a disc clamp 300 of the substrate support 1000 according to an embodiment of the present invention.

The substrate support 1000 may include a disc clamp 300 and a clamp cover 310.

The disc clamp 300 may have a cylindrical shape in which a stepped portion 320 is formed at an upper outer side thereof. The susceptor 100 may be coupled to the disc clamp 320 as the central portion of the susceptor 100 is seated on the stepped portion 320. A shaft coupling part 350 coupled to the shaft 500 may be formed at a lower portion of the disc clamp 300.

The clamp cover 310 may be disposed at an upper portion of the disc clamp 300 to fix the susceptor 100 coupled to the stepped portion 320.

Specifically, as the stepped portion 320 is formed at the upper portion of the disc clamp 300, the susceptor 100 may be seated thereon. Thereafter, the susceptor 100 seated on the stepped portion 320 may be fixed by the clamp cover 310. As the shaft coupling part 350 is disposed at the lower portion of the disc clamp 300, the susceptor 100 and the shaft 500 may be further easily assembled and fixed to each other.

A plurality of lifting gas connection flow paths 330 may be defined in the disc clamp 300. Specifically, the lifting gas connection flow paths 330 may be formed so that the second lifting gas flow path 530 defined in the shaft 500 is connected to the first lifting gas flow path 130 defined in the susceptor 100. That is, the lifting gas connection flow paths 330 may be formed such that one flow path formed at the lower side is divided into a plurality of flow paths formed at the upper side.

A plurality of movement gas connection flow path 340 may be defined in the disc clamp 300, Specifically, the movement gas connection flow paths 340 may be formed so that the plurality of second movement gas flow paths 540 defined in the shaft 500 are connected to the first lifting gas flow path 140 defined in the susceptor 100.

That is, as illustrated in FIG. 1, the lifting gas flow paths including the lifting gas holes 30, the first lifting gas flow paths 130, the lifting gas connection flow paths 330, the second lifting gas flow paths 530, and the third lifting gas flow paths 630 may be communicated with each other and connected to the lifting gas supply unit 4000. Here, as the lifting gas is injected from the lifting gas supply unit 4000 to the bottom surface of the satellite 200 from the bottom surface of the pocket groove 120 through the lifting gas flow paths, the satellite 200 may be floated.

Also, as illustrated in FIG. 1, the movement gas flow paths including the movement gas holes 40, the first movement gas flow paths 140, the movement gas connection flow paths 340, the second movement gas flow paths 540, and the third movement gas flow paths 640 may be communicated with each other and connected to the movement gas supply unit 5000. Here, as the movement gas is injected from the movement gas supply unit 5000 to the bottom surface of the satellite 200 in the tangential direction from the bottom surface of the pocket groove 120 through the movement gas flow paths, the satellite 200 may be rotated.

Here, the plurality of pocket grooves 120 may be individually controlled as each of the plurality of pocket grooves 120 is connected with the movement gas supply unit 5000 and individually supplies the movement gas.

FIGS. 10A, 10B, 11A, and 11B are graphs representing a relationship between lifting height variation and a rotation speed of the substrate according to the present invention and the related art.

Figure 10A:
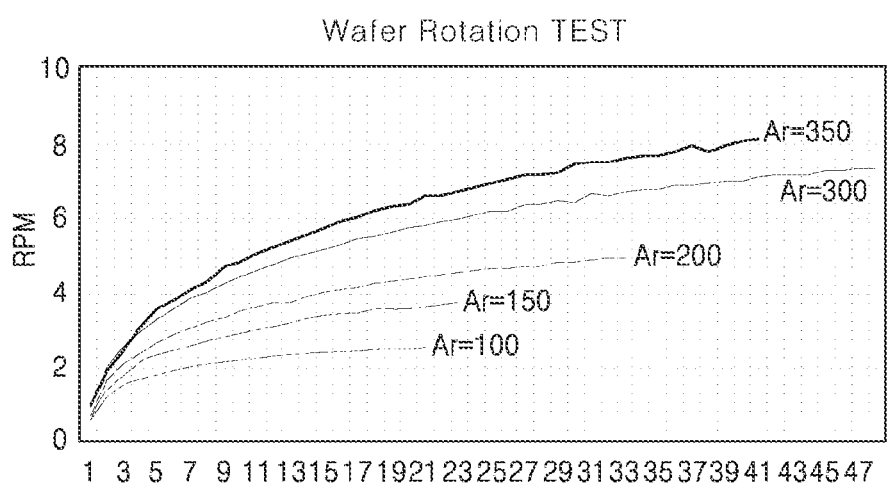
FIGS. 10A and 10B are graphs representing a relationship between a lifting height variation and a rotation speed of a substrate according to the related art.

In an experiment of the related art, a rotation speed and a floating height according to a time are measured when lifting and rotation movement are performed by introducing one gas. As illustrated in FIG. 10A, the substrate processing apparatus of the related art shows that a rotation speed of a substrate continuously increases even when a predetermined time elapses instead of being constant and stable.

Figure 10B:
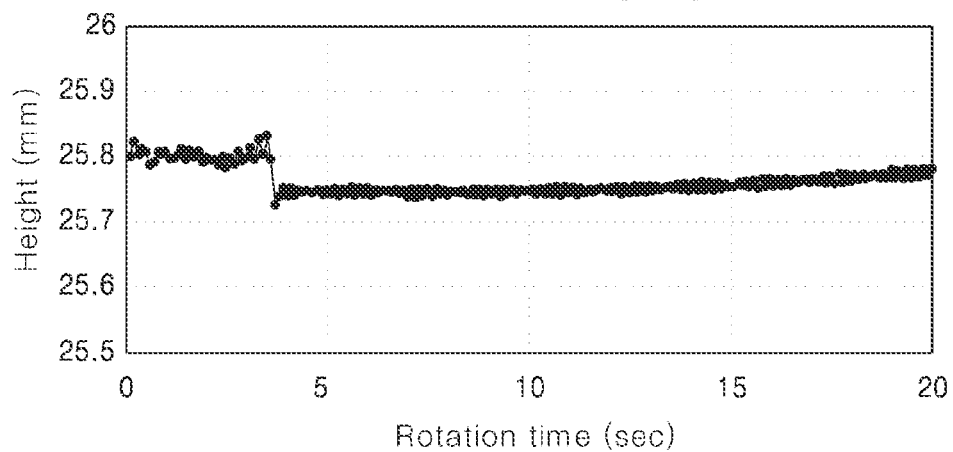

Also, as illustrated in FIG. 10B, since the substrate processing apparatus of the related art performs only rotation movement without variation in height for an initial four seconds, particles caused by friction between the substrate (or the satellite) and the susceptor may be generated, and a floating height may not be adjusted while maintaining the rotation speed RPM of the substrate.

Figure 11A:
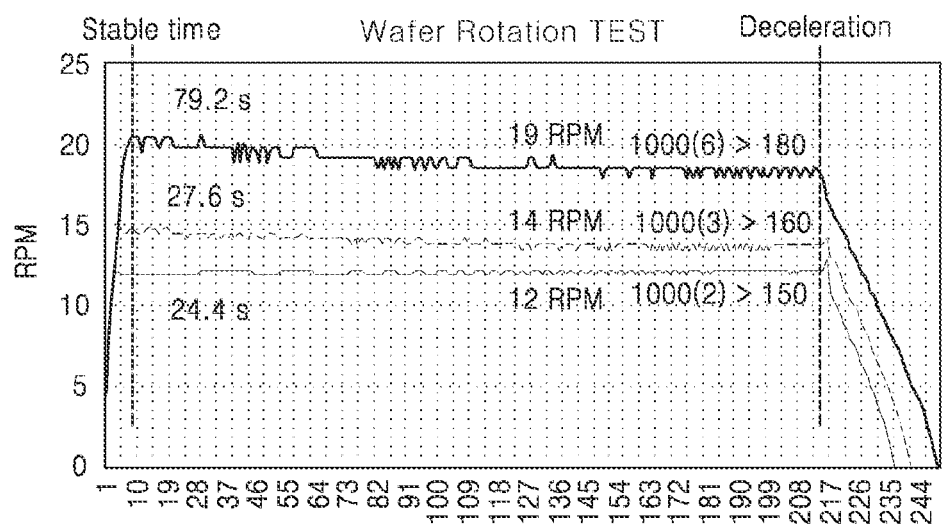
FIGS. 11A and 11B are graphs representing a relationship between a lifting height variation and a rotation speed of a substrate according to the present invention.
Figure 11B:
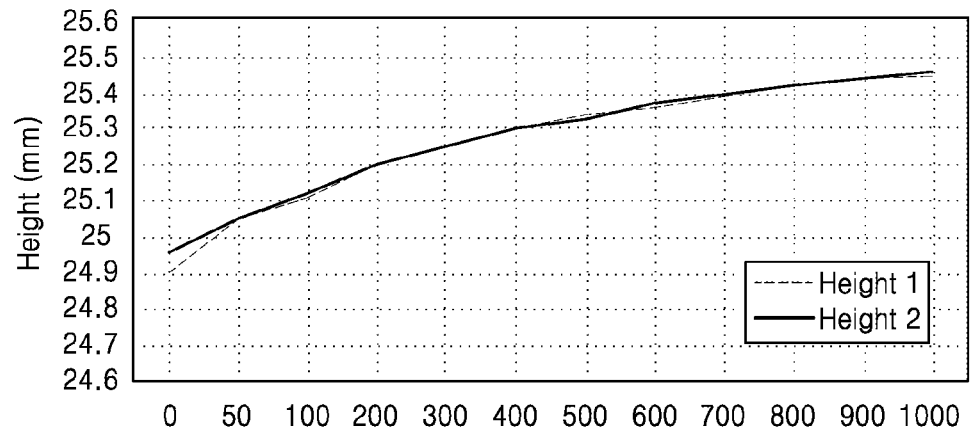

In an experiment through the substrate processing apparatus according to the present invention, a rotation speed and a floating height of the substrate according to a time are measured in case of separately controlling the lifting and the rotation movement. As illustrated in FIG. 11A, the substrate processing apparatus according to the present invention shows that the rotation speed of the substrate becomes stable after a predetermined time (24.4 s, 27.6 s, 79.2 s) elapses according to the rotation speed (12 RPM, 14 RPM, 19 RPM) of the substrate. Also, as illustrated in FIG. 11B, the floating height of the substrate gradually increases as a flow rate of a gas increases. Thus, the height of the substrate may be adjusted to be optimized by controlling the flow rate of the lifting gas according to processes while the substrate is processed.

That is, the plurality of satellites 200 are floated by the pressure of the lifting gas supplied from the plurality of gas holes 30 and are rotated by the pressure of the movement gas supplied from the plurality of movement gas holes 40. Thus, the plurality of satellites 200 may be stably floated and then be rotated, and the RPM may be controlled according to the flow rate of the movement gas during rotation.

Figure 9:
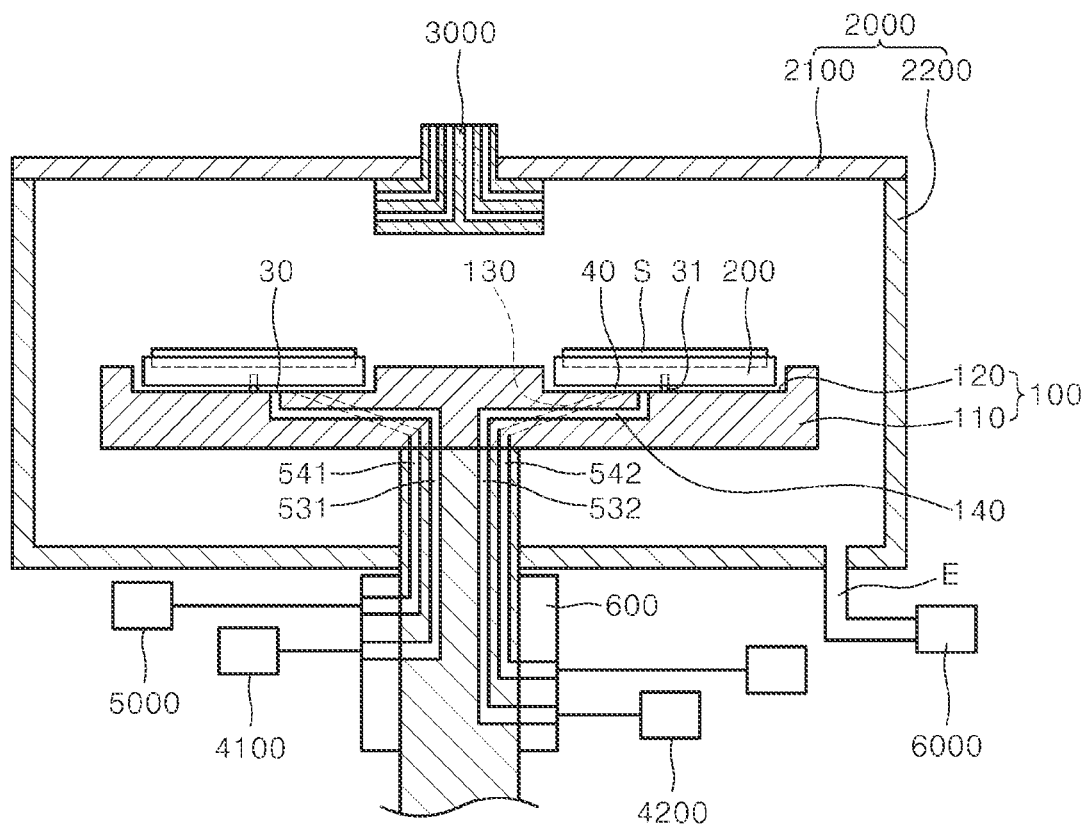
FIG. 9 is a schematic cross-sectional view illustrating a substrate treating apparatus according to another embodiment of the present invention.

In addition, although one second lifting gas flow path 530 is formed in the shaft 500 in this embodiment, the embodiment of the present invention is not limited thereto. For example, as illustrated in FIG. 9, the plurality of second lifting gas flow paths 531 and 532 may be formed and individually connected to the pocket grooves 120, respectively.

Also, the plurality of second lifting gas flow paths 531 and 532 may individually control the flow rate of the gas introduced from the plurality of lifting gas supply units 4100 and 4200.

For example, each of the lifting gas supply units 4100 and 4200 may supply the lifting gas for individually floating the plurality of satellites 200, on which the plurality of substrate S are seated, in the plurality of pocket grooves 120. Thus, the present invention may exhibit an effect in which although one satellite 200 is deviated from the pocket groove 120 of the susceptor 100 while the process of processing the plurality of substrates S is performed, the plurality of satellites 200 floating in other pocket grooves 120 are not affected.

Therefore, the substrate support 1000 and the substrate processing apparatus including the same according to embodiments of the present invention may sufficiently ascend the plurality of satellites 200 by the lifting gas through the plurality of lifting gas holes 30 during the process of processing the substrate. Thereafter, as the plurality of satellites 200 are rotated by the movement gas through the plurality of movement gas holes 40, i.e., the satellites 200 are rotated after the substrates are sufficiently and stably floated, high speed rotation may be performed according to the flow rate of the movement gas, and generation of particles during rotation may be reduced.

Also, the flow rate of the movement gas supplied to the pocket groove 120 may he individually controlled to real-time sense although one satellite 200 is deviated from the pocket groove 120, and the plurality of satellites 200 floating and rotating in other pocket grooves 120 may not be affected.

Thus, growth of the thin-film on the substrate S may be further uniformly performed to exhibit an effect of enhancing a process quality of the substrate S and increasing a process yield. Also, the present invention exhibits an effect of improving processability by simplifying the shape of the susceptor 10 that has a difficulty in processing and thus saving costs.

A method for processing a substrate by using the above-described substrate processing apparatus according to an embodiment of the present invention may include: a process of loading each of the satellites 200 on which each of the substrates S is seated to be seated on the substrate support 1000 in the process chamber 2000; a process of floating the plurality of satellites 200 on which the plurality of substrates S are seated, respectively, from the plurality of pocket grooves 120 by injecting a lifting gas supplied from the lifting gas supply unit 400 from the plurality of pocket grooves 120 defined in the susceptor 100; a process of rotating the plurality of satellites 200 in a floating state on the susceptor 100 so that the plurality of substrates S are rotated on the susceptor 100 by injecting a movement gas supplied from the movement gas supply unit 500 from the plurality of pocket grooves 120 to the plurality of satellites 200; and a process of processing the plurality of substrates S by injecting a process gas into the process chamber 2000 through the gas injection unit 3000.

For example, in the process of processing the plurality of substrates S, the method fir processing the substrate allows a high speed rotation according to a flow rate of the movement gas by rotating the plurality of satellites 200 after sufficiently ascending the plurality of satellites 200 by the lifting gas. Also, in the process of processing the substrates, the rotation movement of the plurality of substrates S seated on the plurality of pocket grooves 120 of the substrate support 1000 may be stably performed.

Here, the method for processing the substrate may include a process of rotating the substrate support 1000 on which the plurality of satellites 200 are seated through the shaft 500 by receiving a rotation force from the driving unit M after the process of rotating the plurality of satellites 200 in the floating state on the susceptor 100. That is, the process of rotating the substrate support 1000 may revolve the plurality of satellites 200 in a floating and rotating state in the plurality of pocket grooves 120 defined in the substrate support 1000 as the substrate support 1000 is rotated.

Also, the method for processing the substrate may include a process of rotating the substrate support 1000 on which the plurality of satellites 200 are seated through the shaft 500 by receiving a rotation force from the driving unit M after the process of loading the plurality of satellites 200. That is, the plurality of substrates S seated on the plurality of satellites 200 may be revolved in the process of rotating the substrate support 1000, and the plurality of substrates S may be rotated in the process of floating and the process of rotating. That is, the process of rotating the substrate support 1000, the process of floating the plurality of satellites 200, and the process of rotating the plurality of satellites 200 may be selectively changed in order according to characteristics of processes.

Figure 12:
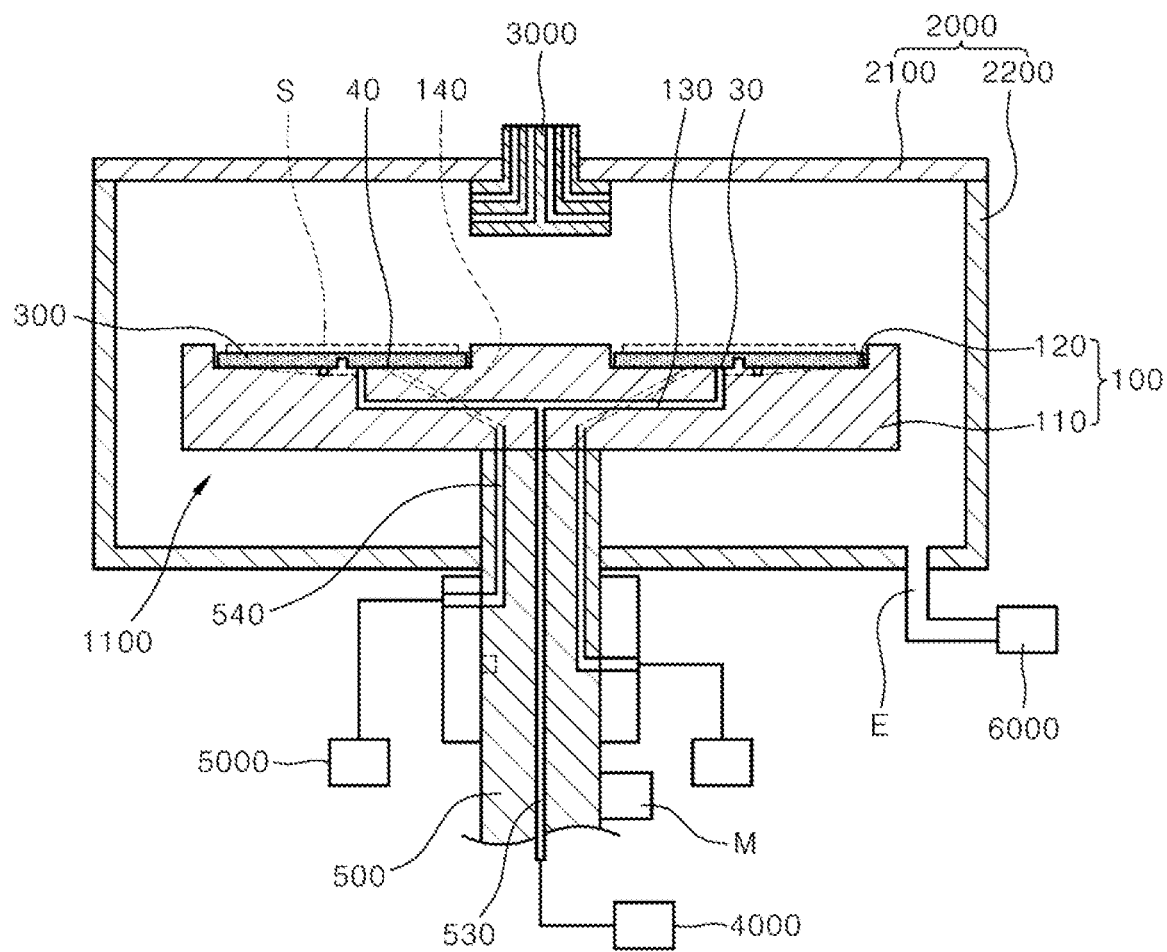
FIG. 12 is a schematic cross-sectional view illustrating a substrate processing apparatus according to another embodiment of the present invention.
Figure 13:
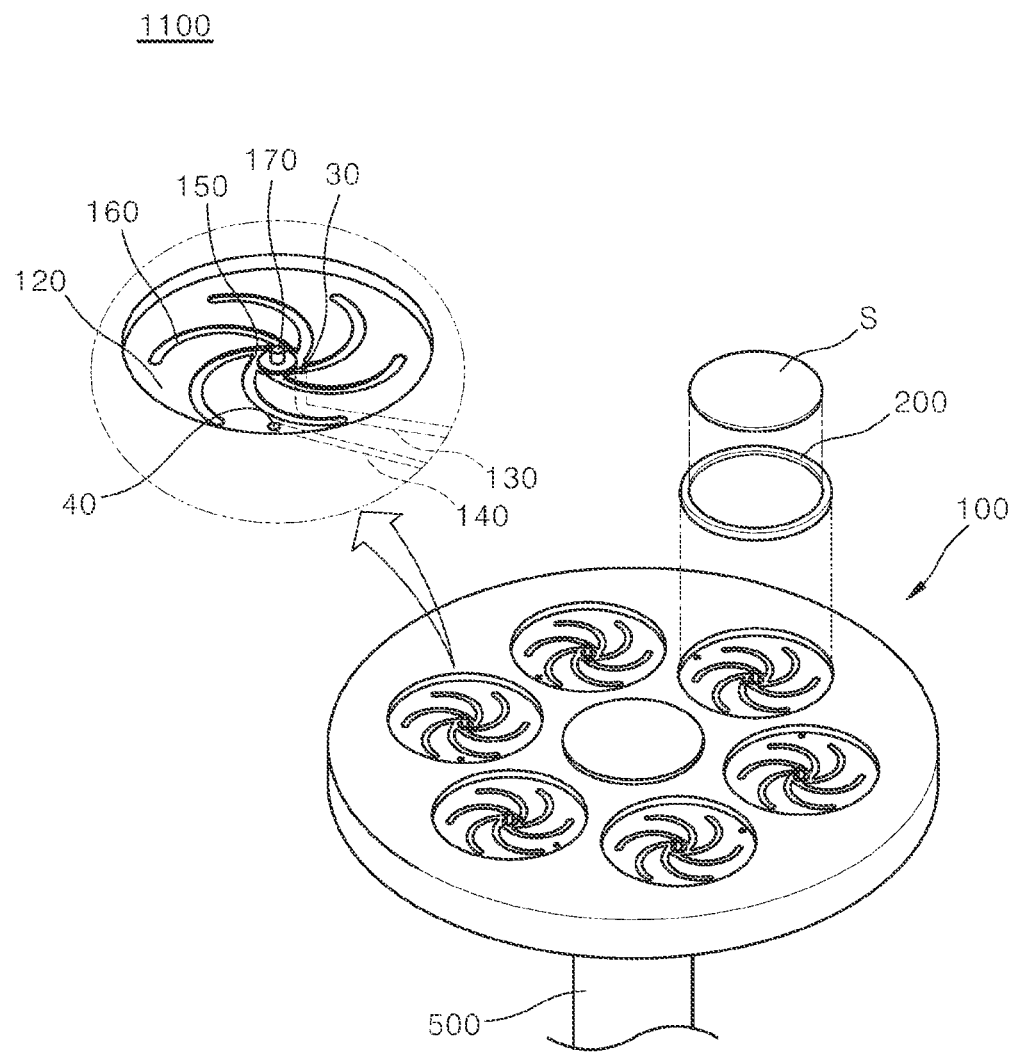
FIG. 13 is a schematic perspective view illustrating a substrate support of the substrate processing apparatus in FIG. 12.
Figure 14:
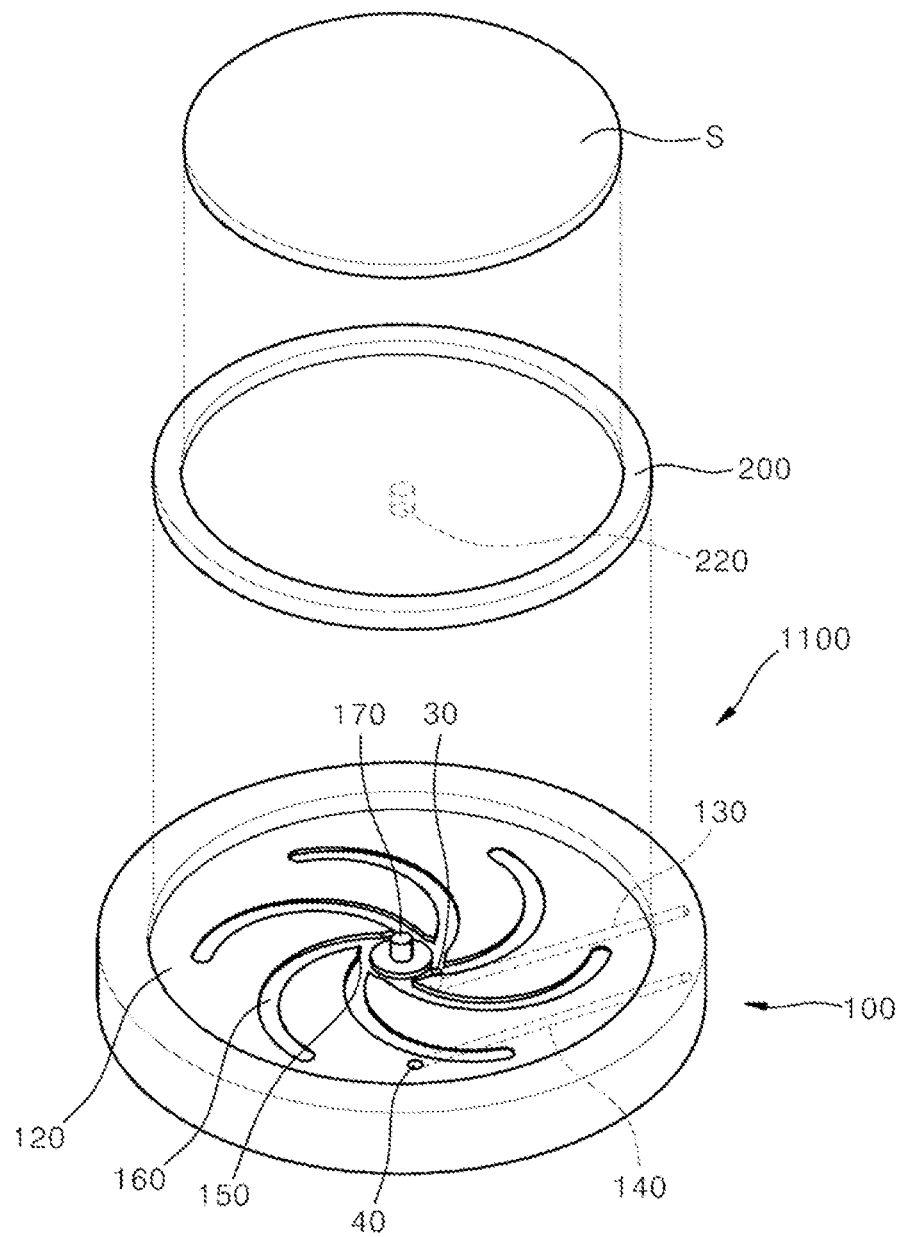
FIG. 14 is a perspective view illustrating a substrate, a satellite, and a susceptor of a substrate support according to another embodiment of the present invention.
Figure 15:
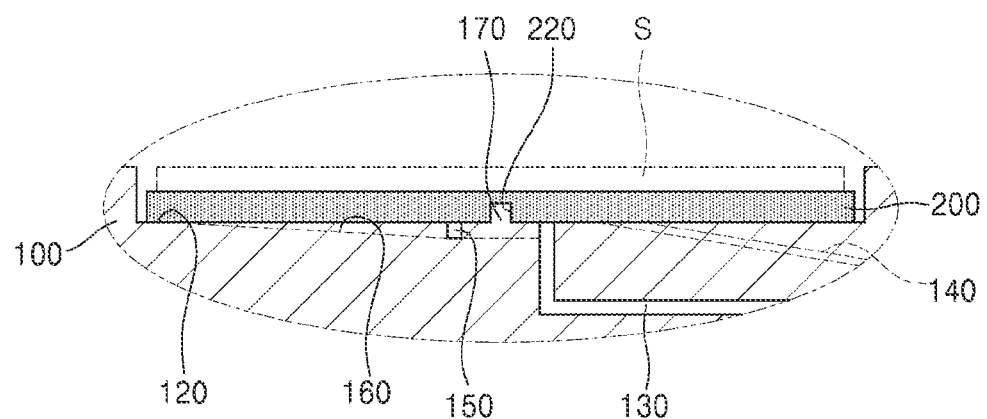
FIG. 15 is a cross-sectional view illustrating a state in which the satellite and the substrate are assembled to the susceptor of the substrate support according to another embodiment of the present invention.

FIG. 12 is a schematic cross-sectional view illustrative a substrate processing apparatus according to another embodiment of the present invention, FIG. 13 is a schematic perspective view illustrating a substrate support 1100 in FIG. 12, FIG. 14 is a perspective view illustrating a substrate S, a satellite 200, and a susceptor 100 of the substrate support 1100, and FIG. 15 is a cross-sectional view illustrating a state in which the satellite 200 and the substrate S are assembled to the susceptor 100 of the substrate support 1100.

As illustrated in FIG. 12, a substrate processing apparatus according to another embodiment of the present invention may include a substrate support 1100, a process chamber 2000, and a gas injection unit 3000.

Since the process chamber 2000 and the gas injection pit 3000 have the same function as those of the substrate processing apparatus according to an embodiment of the present invention, a description thereof will be omitted.

As illustrated in FIGS. 12 to 14, the substrate support 1100 of the substrate processing apparatus according to another embodiment of the present invention may include a susceptor 100, a shaft 500, and a satellite 200.

The susceptor 100 may have a circular plate shape and be installed in a process space, and may include at least one pocket groove 120 recessed from a top surface of the susceptor 100 so that at least one substrate S is seated thereon and a first lifting gas flow path 130 and a first movement gas flow path 140, Which pass through from a bottom surface of each of the pocket grooves 120 to a bottom surface of the susceptor 100.

Specifically, the susceptor 100 may include: a susceptor body 110 in which the plurality of pocket grooves 120 are radially arranged with equal angles with respect to a rotation shaft on the top surface thereof so that the plurality of substrates S are processed at once; and a plurality of pocket grooves 120 defined in a top surface of the susceptor body 110 and having a shape corresponding to the plurality of substrates.

In the susceptor 100, a lifting gas hole 30 and a movement gas hole 40 may be defined in a bottom surface of the pocket groove 120, and a first lifting gas flow path 130, which passes through from the lifting gas hole 30 to a bottom surface of the susceptor 100, and a first movement gas flow path 140 may be defined.

The lifting gas hole 30 may be defined at a point spaced a predetermined distance from a central portion of each of the plurality of pocket grooves 120. Here, the lifting gas hole 30 may be formed so that a lifting gas is supplied therethrough to float the satellite 200.

For example, as illustrated in FIGS. 13 and 14, six pocket grooves 120 may be spaced the same distance from each other with equal angles with respect to the rotation shaft at an upper portion of the susceptor body 110. Here, the lifting gas hole 30 is formed at the point spaced a predetermined distance from the central portion of each of the plurality of pocket grooves 120. The lifting gas hole 30 may be connected with the first lifting gas flow path 130 defined in the susceptor 100.

The first lifting gas flow path 130 may pass through from the bottom surface of the susceptor 100 to each of the plurality of lifting gas holes 30. Here, the first lifting gas flow path 130 may be formed such that a plurality of flow paths each extending from a central portion of the bottom surface of each of the pocket groove parts 120 are coupled and communicated at a central portion of the bottom surface of the susceptor 100.

That is, the first lifting gas flow path 130 is a flow path divided into a several branches from a lower portion of the susceptor 100. For example, the lifting gas may be introduced from one inlet defined in the bottom surface of the susceptor 100 and supplied to each of the plurality of lifting gas holes 30 defined in the plurality of pocket groove parts 120.

All of the lifting gases may be introduced to each of the first lifting gas flow paths 130 through the shaft 500. The introduced lifting gas is supplied from each of the lifting gas holes 30 to each of the satellites 200.

Here, the lifting gas may provide a pressure for floating the satellite 200, and an inert gas such as a nitrogen gas may be used as the lifting gas.

Each of a plurality of movement gas holes 40 is defined at one side of each of the plurality of pocket grooves 120. Here, at least one portion of the first movement gas flow path 140 may be inclined to the susceptor 100 so that the plurality of movement gas holes 40 supply the movement gas to rotate the plurality of satellites 200. That is, the first movement gas flow path 140 may be inclined in a direction parallel to a tangent line of the satellite 200 from the bottom surface of the pocket groove 120 to a predetermined distance inside the susceptor 100 so that the movement gas injected from the bottom surface of the pocket groove 120 is introduced in a tangential direction of the satellite 200 to rotate the satellite 200.

For example, as illustrated in FIGS. 13 and 14, the six pocket grooves 120 may be formed with equal angles with respect to the rotation shaft at the upper portion of the susceptor body 110. Here, each of the movement gas holes 40 may he formed at a position spaced a predetermined distance from a center of each of the pocket grooves 120. The movement gas holes 40 may be connected to the plurality of first movement gas flow paths 140, respectively, which are defined in the susceptor 100.

Gases having a predetermined pressure may be introduced from the plurality of movement gas holes 40. The movement gas may be introduced to a lower peripheral portion of the satellite 200 so that the satellite 200 floating at the upper portion of the pocket groove 120 by the lifting gas is rotated in the pocket groove 120 instead of being deviated from the pocket groove 120. Here, the satellite 200 in a floating state may be rotated by a pressure of the introduced movement gas.

The first movement gas flow path 140 may be connected from a top surface of the shaft 500 to the plurality movement gas holes 40 through the inside of the susceptor 100. Also, an inclined section B extending a predetermined distance from the plurality of movement gas holes 40 may be formed in a tangential direction with respect to the satellite 200. Thus, as the movement gas is introduced in the tangential direction to the satellite 200 from the first movement gas flow path 140, the movement gas may rotate the plurality of the satellites 200.

As illustrated in FIG. 12, the shaft 500 may have a central shaft coincided with the rotation shaft disposed at the lower portion of the susceptor 100 to support the susceptor 100 and be rotated in conjunction with the susceptor 100 as the driving unit M transmits a power for rotating the susceptor 100 thereto.

The shaft 500 may include a second lifting gas flow path 530 communicated with the first lifting gas flow path 130 and passing through the shaft 500 from a top surface to a bottom surface thereof and a second movement gas flow paths 540 communicated with the first movement gas flow paths 140, respectively, and passing through the shaft 500 from the top surface to the side surface thereof.

The second lifting gas flow path 530 may be communicated with the first lifting gas flow path 130 at the top surface of the shaft 500 in order to supply the lifting gas to the susceptor 100 and pass through from the top surface to the bottom surface of the shaft 500.

As illustrated in FIG. 12, the second lifting gas flow path 530 may be formed at an inner central portion of the shaft 500 and connected to a lifting gas supply unit 4000 disposed at the outside. That is, the second lifting gas flow path 530 is a flow path transferring the gas received from the lifting gas supply unit 4000 to the first lifting gas flow path 130.

The second movement gas flow paths 540 may be communicated with the first movement gas flow paths 140, respectively, at the top surface of the shaft 500 in order to supply the movement gas to the susceptor 100.

The second movement gas flow path 540 may be provided in plurality in the shaft 500. Each of the plurality of second movement gas flow paths 540 may have one side connected to each of the plurality of first movement gas flow path 140 and the other side connected to a side portion of the shaft 500. That is, the second movement gas flow path 540 may be a flow path transferring a gas supplied from the movement gas supply unit 5000 through the shaft 500 to the plurality of first movement gas flow paths 140.

Figure 16:
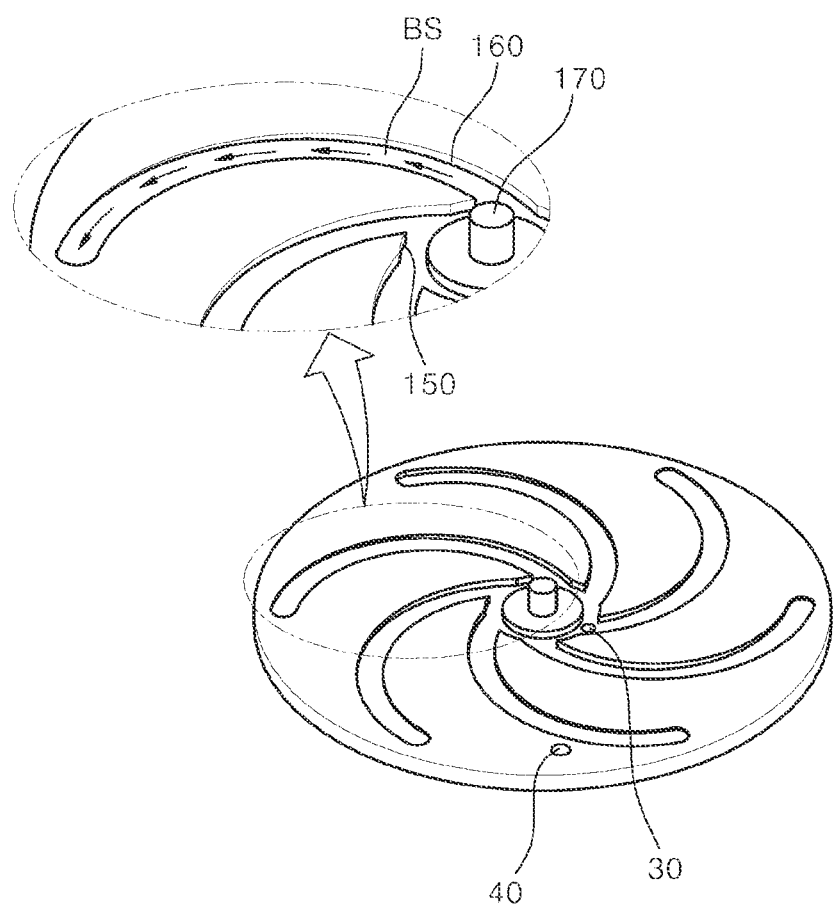
FIG. 16 is a perspective view illustrating a flow groove according to another embodiment of the present invention.
Figure 17:
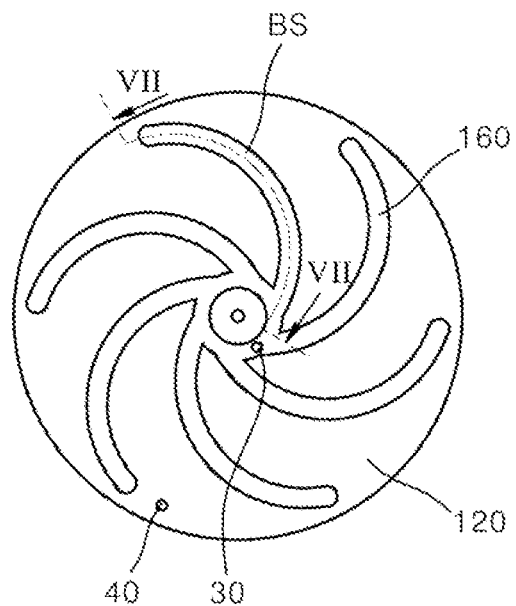
FIG. 17 is a perspective view illustrating a top surface of the flow groove according to another embodiment of the present invention.
Figure 18:
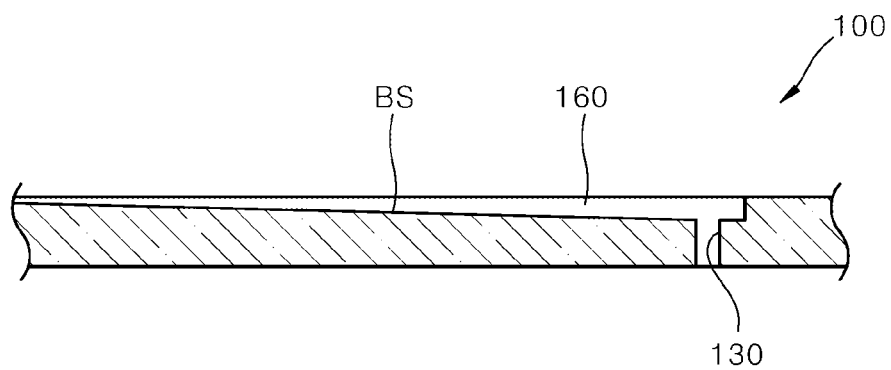
FIG. 18 is a schematic cross-sectional view taken along line VII-VII of FIG. 17.

FIG. 16 is a schematic perspective view illustrating a gas flow groove 160 according to another embodiment of the present invention, FIG. 17 is a view illustrating a top surface of the gas flow groove 160 according to another embodiment of the present invention, and FIG. 18 is a schematic cross-sectional view taken along line VII-VII of FIG. 17.

As illustrated in FIGS. 16 to 18, the flow groove 160 may be a groove diffusing the lifting gas supplied through the first lifting gas flow path 130 from a central area of the pocket groove 120 in a circumferential direction.

Also, the flow groove 160 may be defined in a top surface of the pocket groove 120 so that the lifting gas diffused through the flow groove 160 flows in a direction opposite to a rotation direction of the satellite 200 to float the satellite 200 or stop the rotation of the satellite 200.

Specifically, a lifting gas path 150, a flow groove 160, and a rotation projection may be formed in the pocket groove 110 of the susceptor 100.

The lifting gas path 150 may have a ring shape to float the satellite 200 seated on the seating surface of the pocket groove 120 and connect the plurality of flow grooves 160, thereby diffusing the lifting gas discharged through the lifting gas hole 30.

The flow groove 160 may include a plurality of grooves each extending from one portion of a central portion of a top surface of the pocket groove 120 to one portion of an edge to rotate the lifting gas in a direction opposite to the rotation direction of the satellite 200.

Thus, as the lifting gas introduced to the first lifting gas flow path 130 defined in the susceptor 100 passes the flow groove 160 through the lifting gas path 150 and is injected in a tangential direction that is the opposite direction of the rotation direction or the opposite direction of the rotation direction of the satellite 200, a gas flow pressure that is opposite to the rotation of the satellite 200 may be generated to further quickly stop the satellite 200.

Also, the flow groove 160 may have a bottom surface BS inclined upward along an injection direction of the lifting gas so that a cross-sectional area gradually decreases in a flow direction of the lifting gas to induce a fast flow of the lifting gas, and the lifting gas is injected toward a bottom surface of the satellite 200 to further effectively transmit a rotation force of the lifting gas to the satellite 200. Here, an inclined angle of the bottom surface BS of the flow groove 160 may be about 0.1° to about 0.2°, and more preferably about 0.15°.

Here, the flow direction of the lifting gas may be the opposite direction of each of the flow direction of the movement gas and the rotation direction of the satellite 200.

That is, when the lifting gas is supplied with a low pressure, the lifting gas may serve to float the satellite 200, and when the lifting gas is supplied with a high pressure, the lifting gas may pass through the flow groove 160 to form a gas flow pressure in the opposite direction of the rotation direction of the satellite. Thus, when the satellite 200 is stopped, the satellite 200 may be stopped by the gas flow pressure in a reverse rotation direction to reduce generation of particles.

As illustrated in FIGS. 12 to 15, the satellite 200 may be installed in the pocket groove 120, the substrate S may be seated on the top surface of the satellite 200, and the satellite may he floated by the pressure of the lifting gas supplied through the first lifting gas flow path 130 and rotated by the pressure of the movement gas supplied through the first movement gas flow path 140 to rotate the substrate S seated on the top surface.

Specifically, the satellite 200 may have a circular plate shape seated in the pocket groove 120 so that the satellite 200 is rotated in the floating state by the pressure of the gas supplied through the susceptor 100 to rotate each of the substrates S seated on the top surface thereof.

As the substrate S is seated on the top surface of the satellite 200, and the satellite 200 in the floating state is rotated by the pressure of the flow gas supplied through the susceptor 10, the substrate S seated on the top surface may be rotated.

Here, a rotation projection 170 having a cylindrical shape may protrude from a central axis of the bottom surface of the pocket groove 120, and a projection groove 220 accommodating at least a portion of the protruding rotation projection 170 may be defined at a central axis of the bottom surface of the satellite 200.

Thus, as the satellite 200 is rotate with respect to the projection groove 220 to Which the rotation projection 170 is inserted, the rotation movement of the satellite 200 may be stably performed.

Like an embodiment of the present invention in FIGS. 4 and 5, each of the plurality of satellites 200 may include a rotation pattern part 210 at an edge of a rear surface of the satellite 200 to collide with the movement gas introduced from the first movement gas flow path 140, Here, the rotation pattern part 210 may be formed on the bottom surface of the satellite 200 in correspondence to the movement gas hole 40 defined in the pocket groove 120.

Like an embodiment of the present invention in FIGS. 4 and 5, the rotation pattern part 210 may be formed as a groove having a windmill shape from a point spaced a predetermined distance from the central axis of the bottom surface of the satellite 200. Thus, the satellite 200 may be rotated by a pressure generated when the movement gas supplied from the movement gas hole 40 passes the inclined section B through the first movement gas flow path 140 and collides with a stepped portion having a groove shape. Here, the stepped portion having a groove shape may be the rotation pattern part 210.

However, the embodiment of the present invention is not limited to the shape of the rotation pattern part 210 in FIG. 5. For example, the rotation pattern part 210 may have various shapes and widths according to a rotation force required for the satellite 200.

FIG. 19 is a table showing a lifting gas flow rate and a movement gas flow rate When the substrate processing apparatus according to another embodiment of the present invention is driven.

A method for processing a substrate by using the above-described substrate processing apparatus according to an embodiment of the present invention may include: a process of loading; a process of floating the satellite 200 from the pocket groove 120; a process of rotating the satellite 200 on the susceptor 100; a process of processing; and a process of stopping the rotation of the satellite 200.

The process of loading loads the substrate S on the substrate support 1000 in the process chamber 200.

The process of floating floats the satellite 200 on which the substrate S is seated from the pocket groove 120 by injecting the lifting gas from the lifting gas hole 40.

That is, the process of floating floats the satellite 200 on which the substrate S is seated from the pocket groove 120 by injecting the lifting gas, which is supplied from the lifting gas supply unit 4000, from the pocket groove 120 defined in the susceptor 100. Here, the lifting gas may be supplied while maintaining a flow rate after increases until a predetermined flow rate, and the movement gas may not be supplied.

For example, the process of floating is a start process in FIG. 19. In the start process, the lifting gas flow rate is in a range from 30 sccm to 50 sccm, and the movement gas is blocked. Thus, the satellite 200 is floated by about 0 mm to about 0.2 mm, and the rotation of the satellite 200 is not performed.

The process of rotation rotates the satellite 200 that is floated by injecting the movement gas from the movement gas hole 40.

That is, the process of rotation rotates the satellite in the floating state on the susceptor 100 so that the substrate S is rotated on the susceptor 100 by injecting the movement gas, which is supplied from the movement gas supply unit 5000, from the pocket groove 120 defined in the susceptor 100.

In the process of rotating, each of the lifting gas and the movement gas may be supplied with a predetermined flow rate so that the satellite 200 is continuously rotated.

The process of processing processes the substrate S by injecting the movement gas and the lifting gas and injecting the process gas into the process chamber 2000 through the gas injection unit 3000.

Since the movement gas has a flow rate greater than that of the lifting gas in the process of processing, a rotation force of the satellite 200 generated by the movement gas may be greater than that of the satellite 200 generated by the lifting gas.

That is, in the process of processing, each of the lifting gas and the movement gas may be supplied with a predetermined flow rate so that the satellite 200 is continuously rotated.

For example, each of the process of rotating and the process of processing is a rotation process in FIG. 19. In the rotation process, the lifting gas may be supplied with a flow rate of 30 sccm to 300 sccm, and the movement gas may be supplied with a predetermined flow rate. Thus, the satellite 200 may continue to maintain the state of being floated by about 0.2 mm and be rotated by the movement gas at the same time.

The process of stopping stops the rotation of the satellite 200 by injecting the lifting gas and blocking the supply of the movement gas.

That is, in the process of stopping, as the lifting gas is supplied in the opposite direction of the rotation direction of the satellite 200 through the flow groove 160, the rotation of the satellite 200 that is rotated on the susceptor 100 by inertia is stopped.

The flow rate of the lifting gas in the process of stopping may be greater than that of the lifting gas in the process of processing in at least partial section, and the flow rate of the lifting gas in the process of stopping may gradually decrease.

In the process of stopping, in order to stop the rotation of the satellite 200, the movement gas supplied from the movement gas supply unit 5000 may be blocked, and the lifting gas supplied from the lifting gas supply unit 4000 may temporarily increases and then gradually decreases for a predetermined time.

For example, the process of stopping is a stop process in FIG. 19. In the stop process, the lifting gas is supplied with a flow rate that gradually decreases from a temporarily preset maximum value to 0, and the movement gas is blocked. Thus, the satellite 200 is floated by about 0.3 mm due to the temporarily increased flow rate of the lifting gas and then gradually descended to 0 mm to he seated on the pocket groove, and the rotation of the satellite 200 may be performed by inertia although the movement gas is not supplied. However, as the lifting gas provides a flow pressure in the opposite direction of the rotation direction of the satellite 200 through the flow groove 160, the satellite 200 may be gradually stopped.

FIGS. 20A and 20B are graphs comparing a relationship between a rotation speed and a rotation count of the substrate according to the present invention and the related art.

As illustrated in FIGS. 20A and 20B, a stop time according to a lifting gas flow rate is 242 s when 12 RPM, 283 s when 14 RPM, and 330 s when 19 RPM in the related art (refer to FIG. 20A). In the present invention (refer to FIG. 20B), according to the lifting gas flow rate, in case A of 300 sccm, 6 RPM is maintained, and a stop time is 40 s, in case B of 500 sccm, 8 RPM is maintained, and a stop time is 55 s, in case C of 700 sccm, 9 RPM is maintained, and a stop time is 60 s, and in case D of 1000 sccm, 11 RPM is maintained, and a stop time is 70 s.

That is, it may be known that the satellite is stopped at extremely faster time in a case when the lifting gas provides a flow pressure in the opposite direction of the rotation of the satellite through the flow groove more than a case when the satellite is rotated by supplying the lifting gas according to the related art and supplying the movement gas.

Thus, the lifting gas may pass through the flow groove 160 and form the flow pressure in the opposite direction of the rotation direction of the satellite 200, and the satellite 200 may be stopped by the gas flow pressure in the reverse rotation direction to reduce the generation of particles.

As described above, the substrate processing apparatus according to the embodiment of the present invention may rotate the satellite at the high speed by the movement gas after the satellite is sufficiently ascended by the lifting gas during the process of processing the substrate according to the flow rate of the movement and further quickly stop the satellite by applying the pressure in the reverse rotation direction by forming the groove between the satellite and the pocket groove so that the flow pressure of the gas is applied to the opposite direction of the rotation direction of the satellite to reduce the generation of particles.

Thus, as the rotation movement of the substrate seated in the pocket groove of the substrate support and the stopping of the satellite are quickly performed during the process of processing the substrate, the growth of the thin-film on the substrate may be further uniformly implemented. Therefore, the substrate processing apparatus exhibiting the effect of increasing the process yield and enhancing the process quality of the substrate may be realized. How ever, the scope of the present invention is not limited to the above-described effect.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A substrate processing apparatus comprising:
a process chamber having a process space in which a substrate is processed;
a substrate support comprising
a susceptor having a plurality of pocket grooves recessed in a circumferential direction from a top surface with a circular plate shape, wherein a satellite is seated in each of the pocket grooves, and wherein the susceptor comprises:
a lifting gas hole defined at a central portion of each of the pocket grooves to float the satellite, so as to inject a lifting gas introduced through a first lifting gas flow path defined in the susceptor; and
a movement gas hole defined at an edge of each of the pocket grooves to rotate the satellite floated in each of the pocket grooves, so as to inject a movement gas introduced through a first movement gas flow path defined in the susceptor, and
a shaft configured to rotate the susceptor, wherein the shaft comprises:
a second lifting gas flow path configured to transfer the lifting gas to the first lifting gas flow path; and
a second movement gas flow path configured to transfer the movement gas to the first movement gas flow path, and
a gas injector disposed at an upper portion of the process chamber to face the substrate support to inject a process gas toward the substrate support, and
a flow groove defined in a bottom surface of each of the pocket grooves so that the lifting gas injected from the lifting gas hole flows in a direction opposite to a rotation direction of the satellite.

2. The substrate processing apparatus of claim 1, wherein the first lifting gas flow path connected to the lifting gas hole defined in each of the pocket grooves is connected to a single second lifting gas flow path.

3. The substrate processing apparatus of claim 1, wherein the second lifting gas flow path is provided in plurality so that a plurality of the second lifting gas flow paths are connected to the first lifting gas flow paths, respectively, connected to the lifting gas hole defined in each of the pocket grooves.

4. The substrate processing apparatus of claim 1, wherein a position fixing projection is disposed at the central portion of each of the pocket grooves of the susceptor, the lifting gas hole is defined around the position fixing projection, and a projection groove to which at least a portion of the position fixing projection is inserted is defined in a bottom surface of the satellite.

5. The substrate processing apparatus of claim 1, wherein the satellite comprises a rotation pattern transmitter transmitting a rotation force to the satellite by the movement gas injected from the movement gas hole and disposed along an edge of a bottom surface of the satellite cooperating with the movement gas hole.

6. The substrate processing apparatus of claim 1, wherein the movement gas hole is inclined to the bottom surface of each of the pocket grooves.

7. The substrate processing apparatus of claim 1, wherein the shaft comprises:
a plurality of shaft ring grooves that are ring-shaped cut portions obtained by cutting a side surface of the shaft by a predetermined depth in a circumferential direction of the shaft and spaced apart from each other in a longitudinal direction of the shaft; and
a plurality of shaft taps defined at one side of the plurality of shaft ring grooves,
wherein the second lifting gas flow path is communicated with the first lifting gas flow path at a top surface of the shaft to supply the lifting gas to the susceptor and passes through from the top surface to a bottom surface of the shaft, and each of the second movement gas flow paths is communicated with the first movement gas flow path at the top surface of the shaft to supply the movement gas to the susceptor and connected from the top surface of the shaft to each of the shaft ring grooves.

8. The substrate processing apparatus of claim 7, further comprising a magnetic fluid seal configured to surround a peripheral portion of the shaft in order to seal the shaft in a rotation manner,
wherein the magnetic fluid seal comprises a plurality of third movement gas flow paths passing through from an inner surface to an outer surface of the magnetic fluid seal and communicated with the second movement gas flow paths, respectively, and each of the third movement gas flow paths is connected to a movement gas supplier through a pipe.

9. The substrate processing apparatus of claim 1, wherein the flow groove extends with a spiral shape in a direction from the lifting gas hole to the edge of each of the pocket grooves.

10. The substrate processing apparatus of claim 9, wherein the flow groove has a bottom surface that is inclined upward along the flow direction of the lifting gas so that a rotation force transmitted to the satellite increases by increasing a flow speed of the lifting gas such that a cross-section thereof gradually decreases in the flow direction of the lifting gas.

* * * * *